United States Patent [19]
Nishi

[11] Patent Number: 5,861,944
[45] Date of Patent: Jan. 19, 1999

[54] EXPOSURE APPARATUS

[75] Inventor: Kenji Nishi, Yokohama, Japan

[73] Assignee: Nikon Corporation, Tokyo, Japan

[21] Appl. No.: 956,765

[22] Filed: Oct. 22, 1997

Related U.S. Application Data

[63] Continuation of Ser. No. 624,753, Mar. 27, 1996, abandoned, which is a continuation of Ser. No. 420,819, Apr. 12, 1995, abandoned.

[30]     Foreign Application Priority Data

Apr. 14, 1994  [JP]  Japan .................................. 6-075766

[51] Int. Cl.$^6$ ................................................ H01L 21/27
[52] U.S. Cl. ................................ 355/68; 355/69; 355/53; 250/205
[58] Field of Search .............................. 355/53, 50, 55, 355/67, 68, 69, 71; 250/208.2, 208.6

[56]            References Cited

U.S. PATENT DOCUMENTS

| | | | |
|---|---|---|---|
| 4,660,968 | 4/1987 | Alderman | 355/68 |
| 4,811,056 | 3/1989 | Kimura | 355/68 |
| 4,924,257 | 5/1990 | Jain | 355/53 |
| 4,970,546 | 11/1990 | Suzuki et al. | 355/53 |
| 5,097,291 | 3/1992 | Suzuki | 355/69 |
| 5,243,377 | 9/1993 | Umatate | 355/53 |
| 5,333,034 | 7/1994 | Gu et al. | 355/32 |
| 5,345,292 | 9/1994 | Shiozawa | 355/67 |
| 5,473,412 | 12/1995 | Ozawa | 355/77 |

FOREIGN PATENT DOCUMENTS

| | | |
|---|---|---|
| 58-153328 | 9/1983 | Japan . |
| 6-29181 | 2/1994 | Japan . |
| 6-349172 | 12/1994 | Japan . |

*Primary Examiner*—Joan Pendegrass
*Attorney, Agent, or Firm*—Shapiro and Shapiro

[57]            ABSTRACT

A scanning exposure apparatus for illuminating an area on a mask has a power supply system for supplying an exposure light source with an electric power regulated to a predetermined state; an illumination intensity varying system provided between the exposure light source and the substrate and adapted to regulate the attenuation rate of the illuminating light; an exposure amount measuring sensor for measuring the exposure energy of the illuminating light emitted from the exposure light source; and a control system for switching a constant power mode for supplying the exposure light source with a predetermined constant electric power through the power supply system, and a constant illumination intensity mode for controlling the function of the power supply system and the illumination intensity varying system in such a manner that the exposure energy measured by the exposure amount measuring sensor is maintained at a predetermined target value.

25 Claims, 12 Drawing Sheets

FIG. 5

| | STATIC EXP | DYNAMIC EXP | MEASUREMENTS |
|---|---|---|---|
| (1) EXPOSURE FIELD SETTING | MOVABLE BLIND CONTROL | MOVABLE BLIND CONTROL | — |
| (2) SHUTTER | SHUTTER CONTROL | MOVABLE BLIND CONTROL SHUTTER OPEN | SHUTTER CLOSE (REFERENCE MARK TURN-ON) |
| (3) WHEN ILLUMINATING CONDITION IS VARIED | CONSTANT POWER LAMP CONTROL | CONSTANT POWER LAMP CONTROL | CONSTANT POWER LAMP CONTROL |
| (4) INTEGRATOR MODE | CONSTANT POWER LAMP CONTROL | CONSTANT ILLUMINATION INTENSITY LAMP CONTROL | CONSTANT POWER LAMP CONTROL (SWITCHING OF FOCUS, CALIBRATION ETC. AT EACH WAFER CHANGE) |
| (5) TIMER MODE | CONSTANT POWER LAMP CONTROL | CONSTANT POWER LAMP CONTROL | |
| (6) INTELLIGENT MODE | NONE | CONSTANT ILLUMINATION INTENSITY LAMP CONTROL | |
| (7) HIGH-SENSITIVITY RESIST | ND FILTER DRIVE SHUTTER CONTROL | ND FILTER DRIVE TARGET ILLUMINATION INTENSITY VALIABLE | — |
| (8) LOW-SENSITIVITY RESIST | SHUTTER CONTROL | SCAN SPEED CONTROL | — |

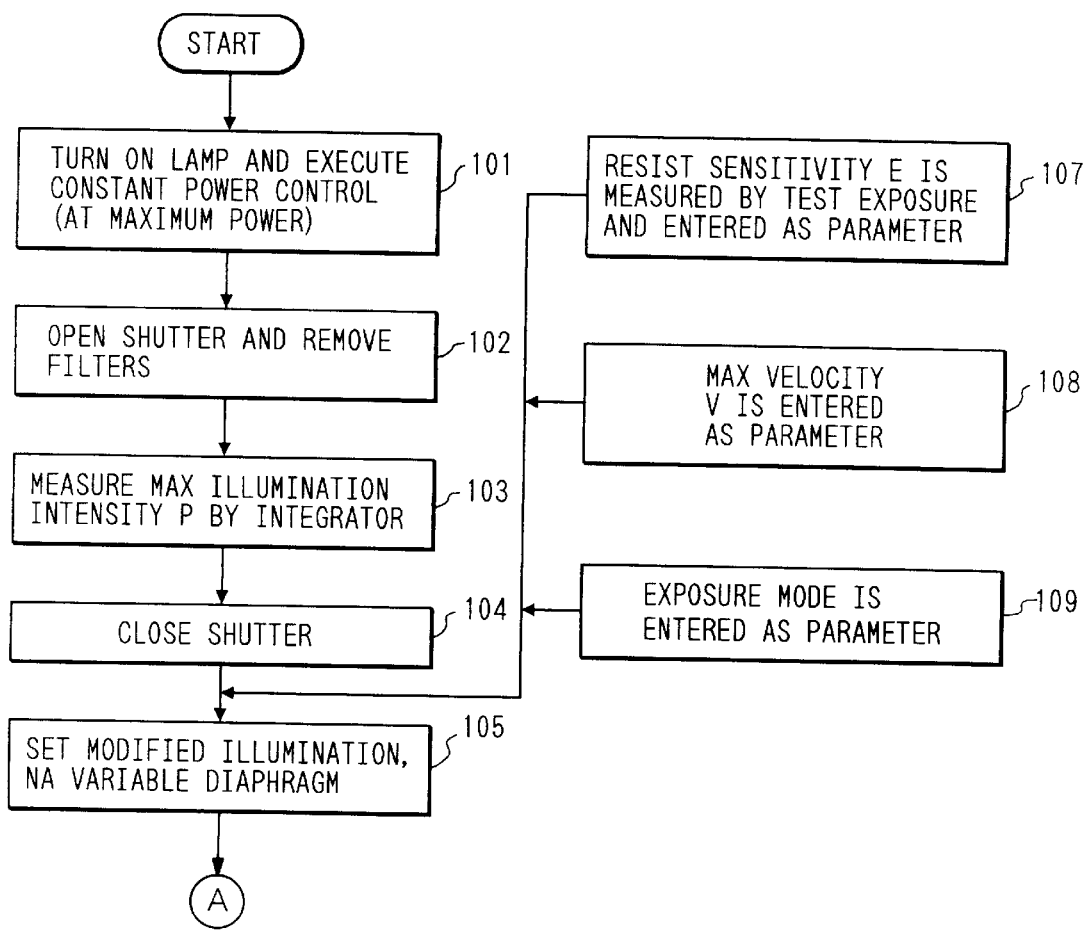

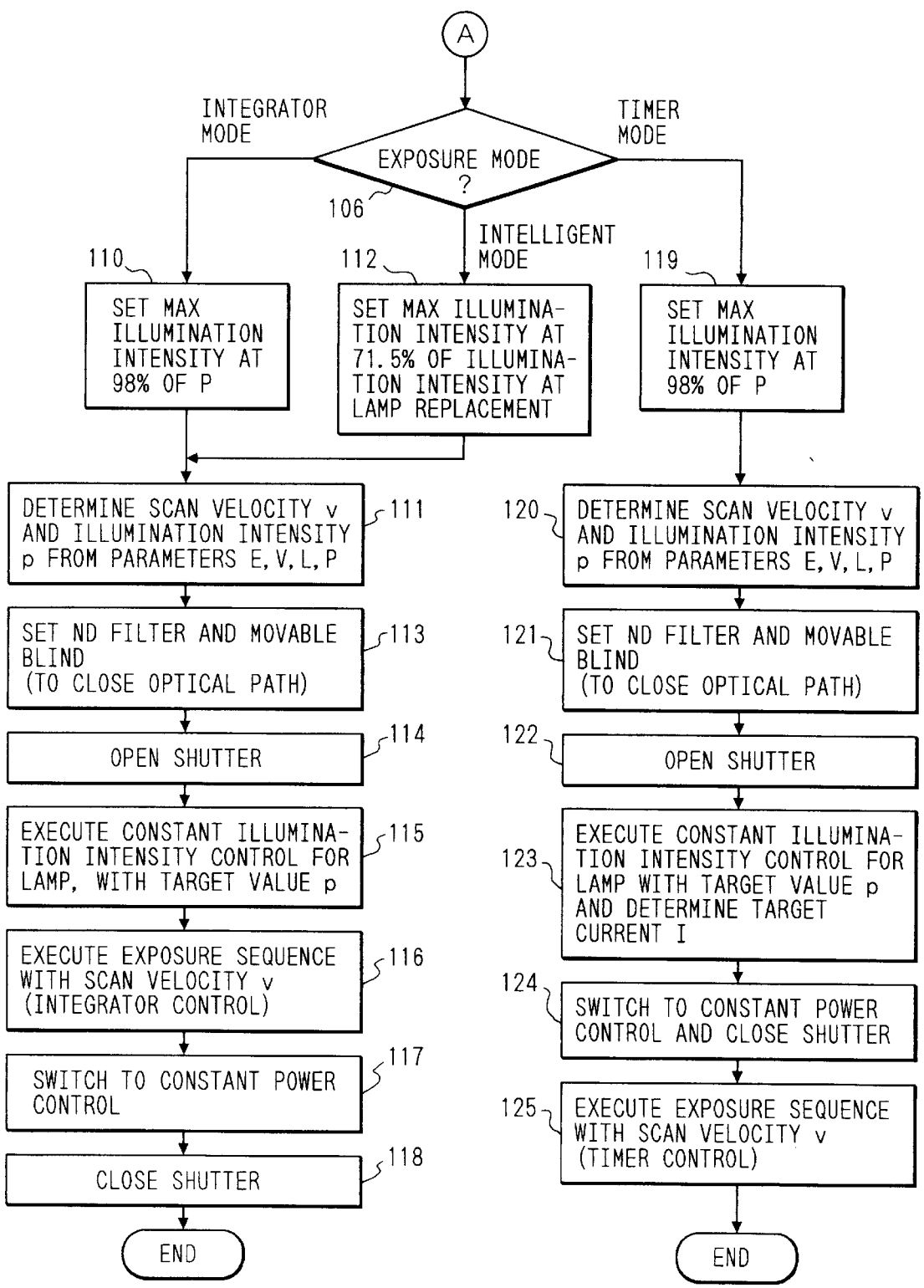

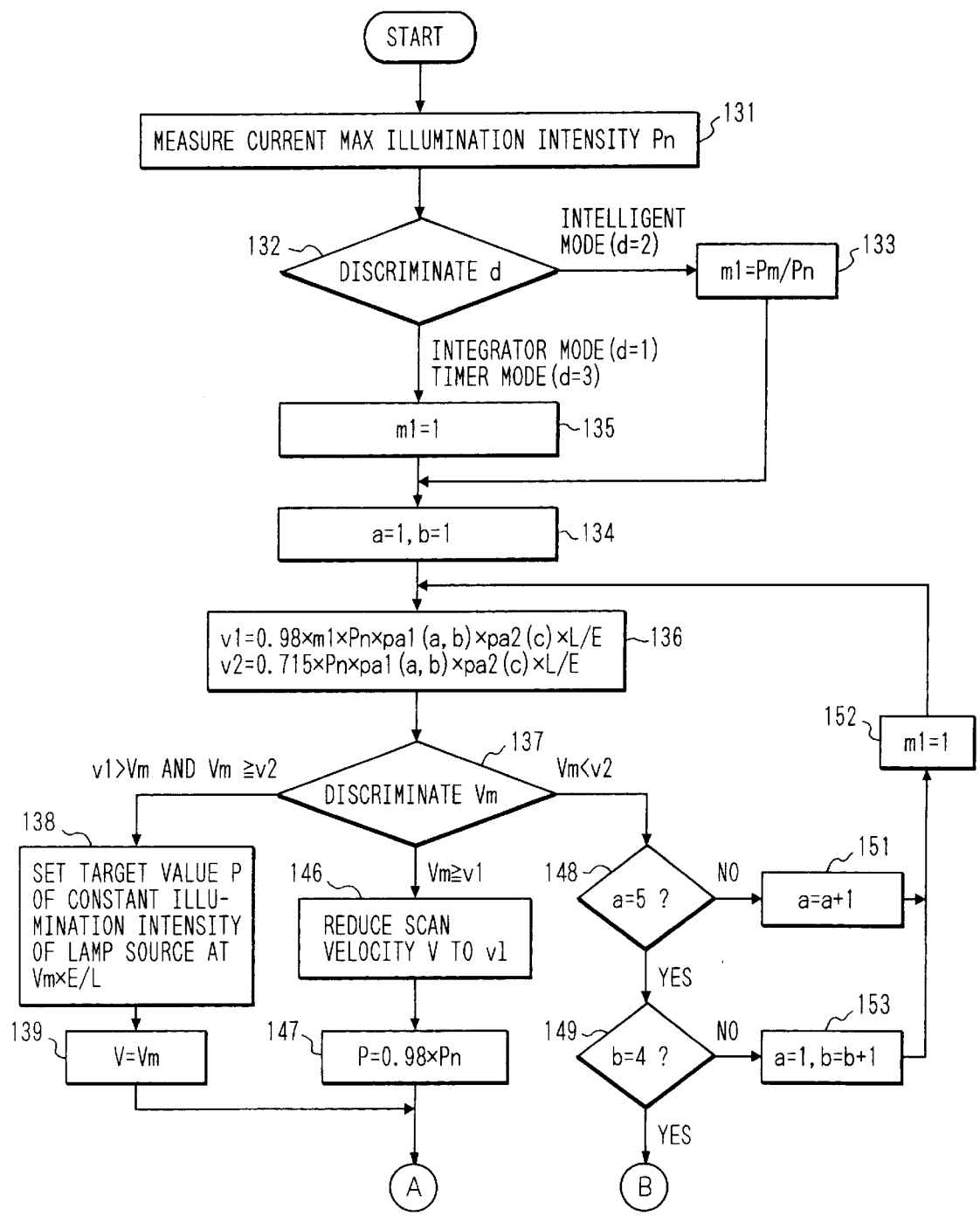

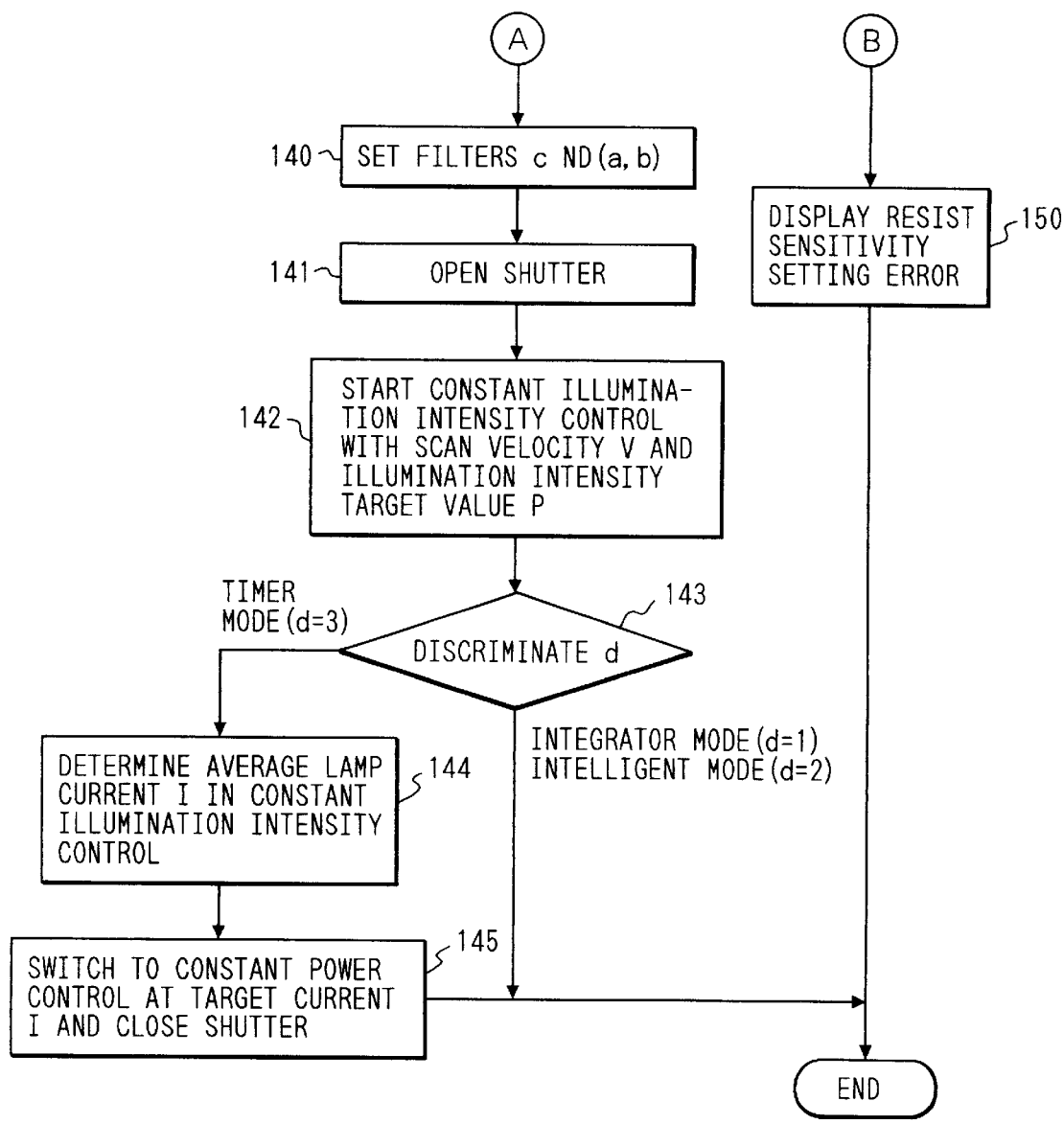

SCANNING
DIRECTION

EXPOSURE APPARATUS

This is a continuation of Ser. No. 08/642,753 filed Mar. 27, 1996, which is a continuation of application Ser. No. 08/420,819 filed Apr. 12, 1995, both now abandoned.

BACKGROUND OF THE INVENTION

1. Field of the Invention

The present invention relates to an exposure apparatus adapted for use in photolithographic manufacture of semiconductor devices or liquid crystal display devices, and more particularly to a scanning exposure apparatus of so-called slit scan method or step-and-scan method in which a mask and a photosensitive substrate are scanned in synchronization with respect to a rectangular or arc-shaped illumination area, whereby patterns on the mask are exposed in succession onto said substrate.

2. Related Background Art

The exposure apparatus conventionally used in the manufacture of the semiconductor devices or the like is principally a projection exposure apparatus of collective exposure method (called stepper) in which the patterns of a reticle (or a photomask) are exposed, by the step-and-repeat method, through a projection optical system to each shot area on a wafer (or a glass plate) coated with photoresist. In such projection exposure apparatus, there is provided an illumination intensity control mechanism for maintaining the exposure amount to each shot area on the wafer within an appropriate range.

FIG. 12 shows a stepper or a projection exposure apparatus provided with a conventional illumination intensity control mechanism. Illuminating light from a mercury lamp 1 is condensed by an elliptical mirror 2, then transmitted by a condensing optical system 3a and a condensing filter system 3 consisting of an optical filter 3b for selecting a desired wavelength region (for example i-line) and reaches a shutter 4, which is opened and closed by a shutter control mechanism 5 based on instructions from a timer control system 6. When the shutter 4 is open, the illuminating light is converted into a substantially parallel light by an input lens 7 and enters a fly's eye lens 8.

On the exit plane of the fly's eye lens 8 there are formed a plurality of images of the light source, whereby the illumination intensity distribution of the illuminating light is made uniform on a reticle 19. Close to said exit plane there is provided a turret plate 22 having plural illuminating diaphragm apertures, and the illuminating light passing one of said illuminating diaphragm apertures enters a mirror 9 of a reflectance of ca. 98%. The illuminating light reflected by the mirror 9 is transmitted by a first relay lens 13 and is limited to a predetermined illumination area on an illuminating blind (variable field diaphragm) 14 controlled by a blind drive system 15, and the illuminating light passing said illuminating blind 14 is relayed by a second relay lens 16, a mirror 17 and a condenser lens 18 and illuminates the illumination area on the reticle 19 with a uniform illumination intensity distribution. Based on said illuminating light, the pattern of the reticle 19 is projected, through a projection optical system 20, with a size reduction for example to 1/5, onto each shot area on a wafer 21.

Leaking light transmitted by the mirror 9 of the reflectance of ca. 98% is transmitted by a condenser lens 10 and enters an integrating sensor 11 consisting of a photoelectric detector, of which output signal is supplied to an illumination intensity calculating system 12. The integrating sensor 11 is so positioned as to be conjugate with the pattern bearing face of the reticle 19, and there is memorized, in advance, a conversion coefficient between the exposure energy at the wafer 21 and the illumination intensity on the integrating sensor 11. Thus the exposure energy per unit time on the wafer 21 can be obtained by multiplying said conversion coefficient in the illumination intensity calculating system 12. The information of said exposure energy per unit time is supplied to a main control system 25, which provides the timer control system 6 with an exposure time obtained by dividing the appropriate exposure amount on the wafer 21 with said exposure energy per unit time. In response the timer control system 6 opens the shutter 4 for said exposure time, whereby the integrated exposure amount on the wafer 21 is controlled to an appropriate amount.

Also for improving the resolution and the depth of focus for periodic pattern of a small pitch, there have recently been proposed a modified light source method of constructing the illuminating diaphragm with plural apertures deviated from the optical axis (cf. Japanese Patent Application Laid-open No. 4-225358) and an annular illuminating method of employing an annular illuminating diaphragm aperture. Therefore, in the configuration shown in FIG. 12, the turret plate 22 includes apertures for such modified light source method and for the annular illumination method. The main control system 25 sends the information on the pattern to be exposed to an illuminating diaphragm aperture control system 24, which in response rotates the turret plate 22 by a motor 23, thereby setting a required diaphragm aperture at the exit plane of the fly's eye lens 8.

However, such change in the shape of the illuminating diaphragm aperture results in a variation in the illumination intensity on the wafer 21, because of the change in the number and distribution of the light source images in the illuminating diaphragm aperture. In spite of such variation in the illumination intensity, an appropriate exposure amount is obtained in each shot area on the wafer, by monitoring the output signal of the integrating sensor 11, having the light-receiving face conjugate with the exposed surface of the wafer 21, and regulating the open time of the shutter 4 according to said output signal.

In such collective exposure method, the unevenness in the illumination intensity in the irradiated plane is suppressed for example by an optical integrator (fly's eye lens 8). Also as the shutter 4 is controlled indirectly by monitoring the integrated exposure amount on the wafer 21, the stability of the illumination intensity in time in each shot area on the wafer 21 has not been a problem. Furthermore, even if the illuminating condition is varied, for example by the modified light source method, between the integrating sensor 11 and the illuminating light source (mercury lamp 1), there merely appears a variation in the time required for the integrated exposure amount to reach the target value, and there has not been encountered any drawback.

Such conventional technology is based on the use of an illumination intensity control mechanism in an exposure apparatus of the collective exposure system in which the exposure of each shot area on the wafer is achieved by a single open/closing operation of the shutter while the reticle and the wafer remain still with respect to the projection optical system. Such collective exposure system has not been associated with any particular drawback as regards the illumination intensity control.

On the other hand, each chip pattern of the semiconductor devices has recently become larger, and the projection exposure apparatus is required to efficiently project the pattern of a larger area onto the wafer. For attaining such larger area, it is particularly necessary to maintain the distortion within a predetermined amount over the entire area. For reducing the distortion and expanding the projection area, attention is being attracted to the scanning exposure apparatus of so-called step-and-scan system or slit scan system, in which, after each shot area on the wafer is stepped to a scan start position, the reticle and the photosensitive substrate are moved in a synchronized scanning motion with respect to a rectangular, arc-shaped or plural-trapezoidal illumination area (hereinafter called "slit-shaped illumination area") whereby the pattern of the reticle is transferred in succession to the shot areas.

The conventional technology, if applied to such scanning exposure apparatus, will result in various drawbacks. Firstly, in the scanning exposure, as each shot area of the wafer is moved in a scanning motion with respect to a slit-shaped exposure field shorter than the length of said shot area, the control of the integrated exposure amount in each shot area is achieved by maintaining the integrated exposure amount, within said slit-shaped exposure field, constant on all the points on the wafer. If the integrated exposure amount varies from point to point on the wafer, the integrated exposure amount will become uneven within each shot area, resulting in an error similar to the unevenness in the illumination intensity in the irradiated plane in the exposure apparatus of the collective exposure system.

In the collective exposure system, the control of the integrated exposure amount is achieved by the shutter 4, but, in the scanning exposure system said control is achieved by moving the reticle and the wafer in a scanning motion with a predetermined constant speed, instead of the open/closing operation of the shutter. For this reason, it is difficult to attain fine adjustment of the integrated exposure amount by time. Consequently in the scanning exposure system, it is necessary to control the illumination intensity so as to continuously maintain the stability of the illumination intensity in time, during the exposure of each shot area. In the collective exposure system, there is already known a constant illumination intensity control method for constantly monitoring the illumination intensity of the illuminating light and effecting feedback of the obtained result to the power source of the illuminating light source thereby controlling the electric power supplied from said power source to the illuminating light source, but such method is not applicable directly to the scanning exposure apparatus.

SUMMARY OF THE INVENTION

In consideration of the foregoing, an object of the present invention is to provide a scanning exposure apparatus capable of maintaining the integrated exposure amount on the photosensitive substrate accurately within an appropriate range.

Another object of the present invention is to provide a scanning exposure apparatus showing reduced fluctuation in the integrated exposure amount on the photosensitive substrate.

According to a first aspect of the present invention, there is provided a scanning exposure apparatus in which an illumination area on a mask bearing a pattern for transfer is illuminated by the illuminating light from an exposure light source, and said mask is moved in a scanning motion with respect to said illumination area while a photosensitive substrate is moved in synchronization in a scanning motion with respect to an exposure area conjugate optically with said illumination area whereby said substrate is exposed in succession to said mask pattern, said apparatus comprising power supply means for supplying the exposure light source with electric power adjusted to a predetermined state; illumination intensity varying means for adjusting the attenuation rate of said illuminating light thereby adjusting the illumination intensity on said substrate; and exposure amount measuring means (11) for continuously measuring the exposure energy of the illuminating light emitted from said exposure light source.

The exposure apparatus of the present invention may further comprise operation mode switching means for selecting either a constant power mode for supplying the exposure light source with a predetermined constant electric power through power supply means, or a constant illumination intensity mode for controlling the function of the power supply means and the illumination intensity varying means so as to maintain the exposure energy, measured by the exposure amount measuring means, at a predetermined target value.

As an example, the operation mode switching means selects said constant illumination intensity mode in case the mask and the substrate are moved in synchronization in scanning motion, and said constant power mode in case the mask and the substrate remain still.

As another example, said operation mode switching means selects said constant illumination intensity mode when the substrate is exposed to the mask pattern, and said constant power mode in the alignment of the mask and the substrate.

As still another example, said operation mode switching means selects said constant power mode in case the mask and the substrate (W) are moved in synchronization in scanning motion for adjusting the scanning state of said mask and wafer, and said constant illumination intensity mode when said mask and said substrate are moved in synchronization in scanning motion for exposing the substrate to the mask pattern.

Also there are desirably provided conversion coefficient memory means for memorizing coefficients of conversion, by a curve approximation (including approximation with straight line portions), from signals, obtained from plural light beams of mutually different light amounts by photoelectric conversion in the exposure amount measuring means, to signals obtained from said light beams by photoelectric conversion in a predetermined reference illumination intensity meter; and signal correction means for correcting photoelectric conversion signals, released from the exposure amount measuring means, with the conversion coefficients read from said conversion coefficient memory means.

According to a second aspect of the present invention, there is provided a scanning exposure apparatus in which an illumination area on a mask bearing a pattern for transfer is illuminated by the illuminating light from an exposure light source, and said mask is moved in a scanning motion with respect to said illumination area while a photosensitive substrate is moved in synchronization in a scanning motion with respect to an exposure area optically conjugate with said illumination area whereby said substrate is exposed in succession to said mask pattern, said apparatus comprising light-receiving means having a slit-shaped light-receiving face where is elongated in the scanning direction (X-direction) of the substrate, with a width D2 in said elongated direction at least equal to the width D1 of the exposure area, and is provided on the positioned plane of the substrate; light-receiving means scanning means for moving said light-receiving means in a scanning motion in a direction (Y-direction) perpendicular to the scanning direction of the substrate (W) with respect to the exposure area; and illumination intensity distribution control means for controlling the illumination intensity distribution in the exposure area in a direction (Y-direction) perpendicular to the scanning direction thereof, based on a photoelectric conversion signal released from the light-receiving means when said light-receiving means is moved in a scanning motion with respect to the exposure in a direction perpendicular to the scanning direction thereof, by means of the light-receiving means scanning means.

The aforementioned first exposure apparatus of the present invention has a constant power mode for driving the exposure light source with a constant electric power for controlling the illumination intensity on the photosensitive substrate, and a constant illumination intensity mode for controlling the exposure energy, measured by the exposure amount measuring means, at a predetermined target value. In case of exposing the substrate to the mask pattern by synchronized scanning motion of the mask and the substrate in a scanning exposure apparatus, the exposure operation is desirably executed in the constant illumination intensity mode in order to maintain the integrated exposure amount at each point on the substrate at the appropriate exposure amount.

However, in the alignment of the mask and the reference mark plate or in the adjustment of the scanning state, it is necessary to switch to the constant power mode in order for example to prevent the irradiation onto the exposure amount measuring means by the shutter. Stated differently, the selective use of the constant illumination intensity mode and the constant power mode allows to precisely maintain the integrated exposure amount on the substrate within an appropriate range at the scanning exposure operation and to use the mode without the exposure amount measuring means in the control operation with the shutter, thereby achieving smooth control.

Also if the sensitivity of the exposure amount measuring means, for monitoring the exposure amount on the substrate, fluctuates among different exposure apparatus, there will result a fluctuation in the integrated exposure amount on the substrate in case of exposure with plural exposure apparatus. This can be prevented by calibrating the exposure amount measuring means with a predetermined reference illumination intensity meter. In such operation, instead of merely determining a single proportion coefficient, measurements are conducted with different illumination intensities and a conversion coefficient to the output signal of the reference illumination intensity meter is determined from each output signal of the exposure amount measuring means, and thus obtained plural conversion coefficients are memorized in conversion coefficient memory means by an approximation for example with an N-th (N being an integer at least equal to 2) order curve. An approximation with straight line portions may also be employed instead of the N-th order curve.

In the exposure operation with the constant illumination intensity mode, there can be obtained an exact exposure amount common to the plural exposure apparatus, by multiplying, in the signal correction means, the output signal of the exposure amount measuring means with thus memorized conversion coefficient.

Then, in the second exposure apparatus of the present invention, there can be determined the fluctuation in the integrated exposure amount, at each point on the substrate (W), in the non-scanning (Y direction), perpendicular to the scanning direction, by the scanning motion of the light-receiving face of the photosensor means in said non-scanning direction with respect to the exposure area. It is thus rendered possible to reduce the fluctuation in the integrated exposure amount on the substrate (W) by employing, as the illumination intensity distribution control means, for example a field diaphragm defining the shape of the exposure area and adjusting the fluctuation of the width of said field diaphragm in said non-scanning direction so as to cancel the fluctuation in the integrated exposure amount in said non-scanning direction.

BRIEF DESCRIPTION OF THE DRAWINGS

FIG. 5 is a table showing the use of constant power control and constant illumination intensity control in the above-mentioned embodiment;

FIG. 7 is comprised of FIGS. 7A and 7B each showing a flow chart of an example of the switching sequence for an integrator mode, an intelligent mode and a timer mode;

FIG. 8 is comprised of FIGS. 8A and 8B each showing a flow chart of an example of the switching sequence for determining parameters in case of illumination intensity control;

DESCRIPTION OF THE PREFERRED EMBODIMENTS

Figure 12:
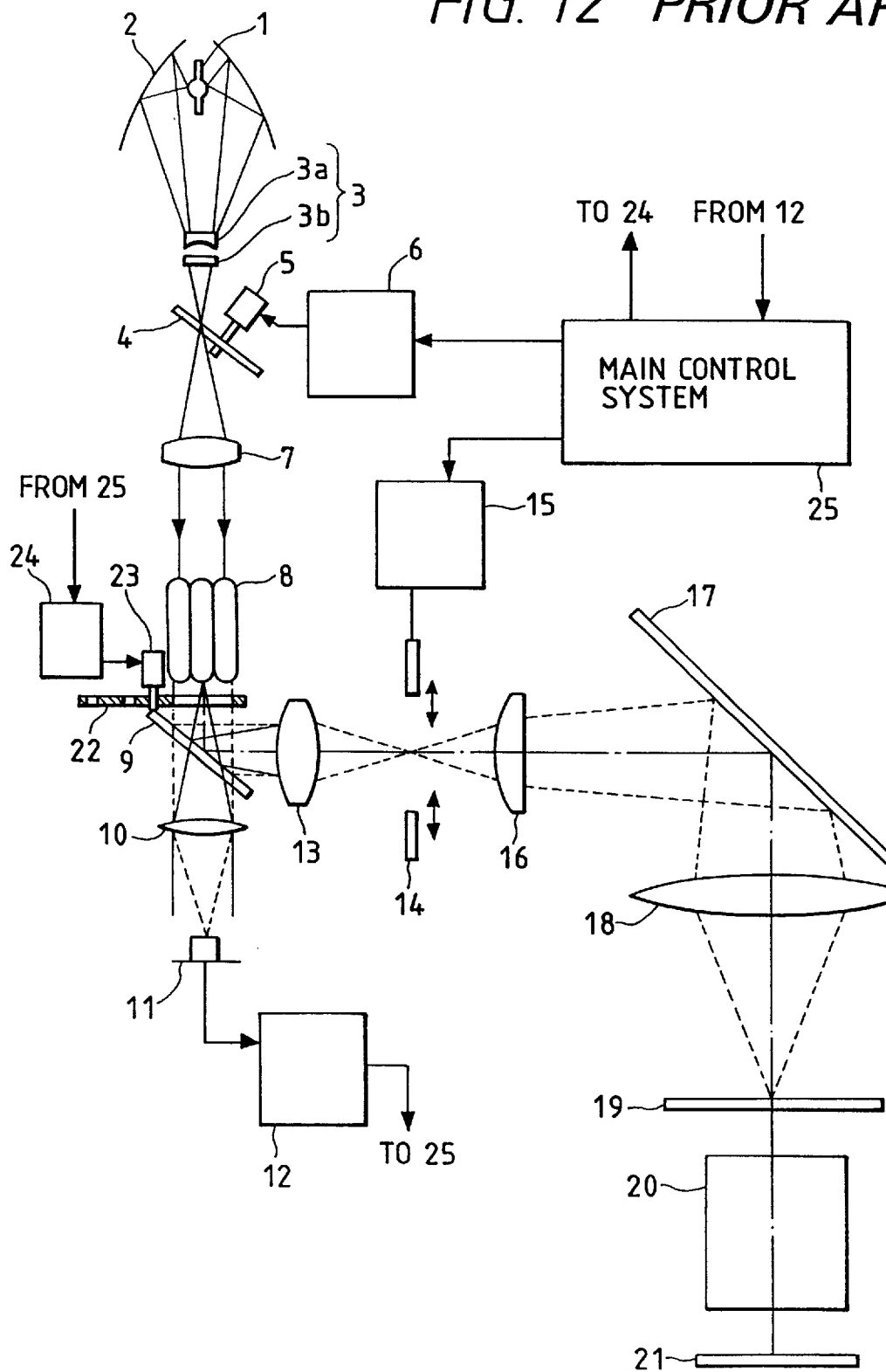
FIG. 12 is a view showing a conventional projection exposure apparatus.

In the following there will be explained an embodiment of the exposure apparatus of the present invention, with reference to the attached drawings. Said embodiment constitutes an application of the present invention to a projection exposure apparatus of step-and-scan system. In the following description, components corresponding to those of the conventional example shown in FIG. 12 are represented by corresponding symbols and will not be explained further.

Figure 1:
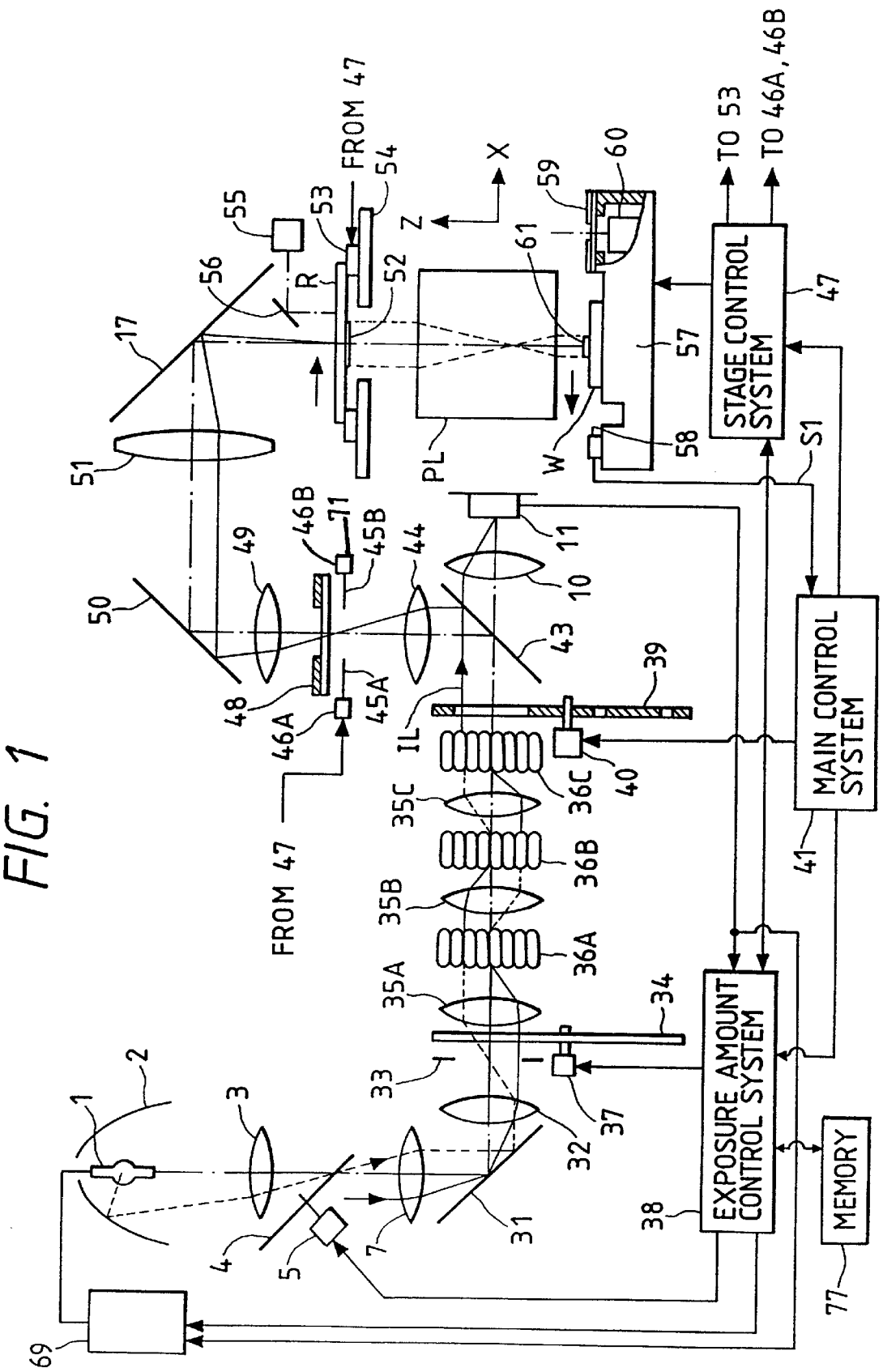
FIG. 1 is a partially cut-off view of a scanning projection exposure apparatus embodying the present invention.

FIG. 1 illustrates the projection exposure apparatus of the present embodiment, wherein the illuminating light from a mercury lamp 1 is condensed by an elliptical mirror 2, then transmitted by a condensing filter system 3 and reaches a shutter 4. When the shutter 4 is open, the illuminating light is converted into a substantially parallel light beam by an input lens 7, then transmitted by a mirror 31 and a condenser lens 32 and reaches a field diaphragm.33.

The illuminating light limited by said field diaphragm 33 is adjusted in the light amount by an ND filter plate 34, then transmitted by a first relay lens 35A and enters a first fly's eye lens 36A in a three-stage fly's eye lens group. The ND filter plate 34 is composed, for example, of plural films of different transmittances, arranged in different radial directions on a glass disk, and a film of a desired transmittance is positioned in the optical path for adjusting the amount of the illuminating light. The amount of the illuminating light after passing the ND filter plate 34 can be varied within a predetermined range, by rotating said ND filter plate 34 by an ND filter driving mechanism 37 provided with a motor. In the present embodiment, the exposure amount to the wafer W is controlled by an exposure amount control system 38, which controls the function not only of the ND filter driving mechanism 37 but also of a shutter control mechanism 5. Furthermore, the exposure amount control system 38 controls the current supplied to the mercury lamp 1 through a mercury lamp current control system 69.

The illuminating light from the light source images formed by the first fly's eye lens 36A is guided through a second relay lens 35B to a second fly's eye lens 36B, and the illuminating light from the light source images formed by said second fly's eye lens 36B is guided through a third relay lens 35C to a third fly's eye lens 36C. As the present embodiment employs the fly's eye lenses 36A to 36C in three stages, many light source images are formed on the exit face of the last fly's eye lens 36C, so that extremely uniform distribution of illumination intensity is obtained on the reticle R and the wafer W. An illumination system diaphragm aperture plate 39, having diaphragm apertures of plural kinds, is provided at the exit face of said third fly's eye lens 36C.

Figure 3:
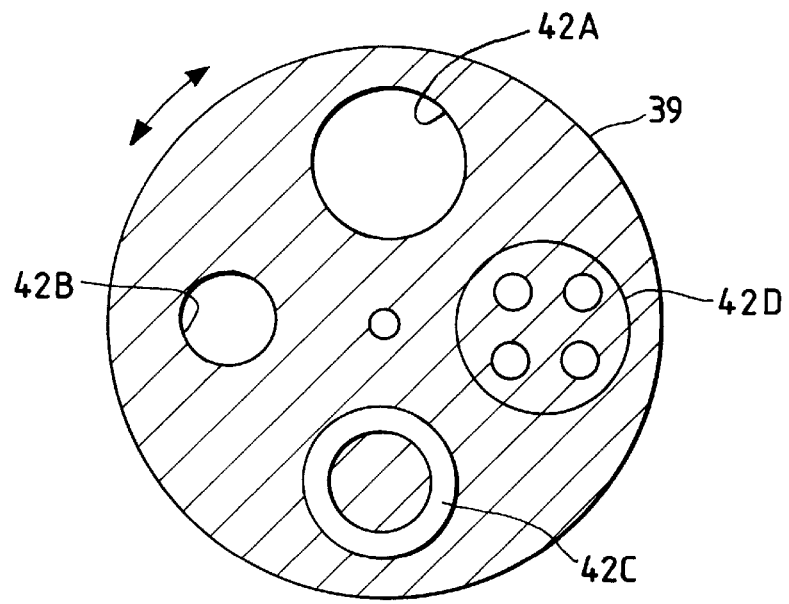
FIG. 3 is a view showing different diaphragm apertures employed in the illuminating system of said embodiment.

FIG. 3 illustrates said illumination system diaphragm aperture plate 39, which is provided thereon, at a substantially equal angular distance, a diaphragm 42A consisting of an ordinary circular aperture, a diaphragm 42B for reducing the coherence factor a, an annular diaphragm aperture 42C for annular illumination, and a modified diaphragm 42D consisting of plural eccentric apertures for modified light source method. The desired one among four diaphragms can be selected by rotating said illumination system diaphragm plate 39.

Again referring to FIG. 1, a main control system 41 controlling the function of the entire apparatus controls the rotation angle of the illumination system diaphragm plate 39 through a modified illumination diaphragm drive mechanism 40 consisting of a driving motor. The illuminating light IL, emerging from the third fly's eye lens 36C and transmitted by a diaphragm selected in the illumination system diaphragm plate 39, enters a mirror 43 of a reflectance of ca. 98%. The illuminating light reflected by said mirror 43 is transmitted by a first relay lens 44 and reaches a movable blind (movable field diaphragm) consisting of two movable blades 45A, 45B. The position of said movable blind 45A, 45B corresponds to the Fourier transformation plate of the exit face of the third fly's eye lens 36C. Thus, the position of the movable blind 45A, 45B is conjugate with the pattern bearing face of the reticle R to be explained later. A fixed blind 48 is positioned in the vicinity of the movable blind 45A, 45B.

The fixed blind 48 is composed of an opaque film deposited on a glass substrate and having a rectangular aperture defining the shape of a slit-shaped illumination area on the reticle R. The illuminating light limited by the movable blind 45A, 45B and the fixed blind 48 is guided by a second relay lens 49, a mirror 50, a condenser lens 51 and a mirror 17 and illuminates a slit-shaped illumination area 52 on the reticle R with a uniform illumination intensity distribution.

As the position plane of the fixed blind 48 is slightly defocused from the conjugate plane of the pattern bearing face of the reticle R, the illumination intensity at the contour of the slit-shaped illumination area 52 varies with a predetermined inclination. The movable blind 45A, 45B serves, at the start and end of the scanning exposure, to prevent that the slit-shaped illumination area covers an area not to be exposed on the reticle R. For this purpose, the movable blades 45A and 45B are rendered movable respectively by slide mechanisms 46A, 46B which constitute a movable blind drive mechanism 71, of which function is controlled by a stage control system 47.

The image of a pattern on the reticle R, within the illumination area 52, is projected through a projection optical system PL with a projection magnification β (for example 1/4, 1/5 etc.), onto a slit-shaped exposure field 61 on the wafer W. Now the Z-axis is defined parallel to the optical axis of the projection optical system PL, while the X-axis is defined in a plane perpendicular to the Z-axis, and parallel to the scanning direction of the reticle R and the wafer W in the scanning exposure, and the Y-axis is defined, in the plane perpendicular to the Z-axis, in a direction perpendicular to the X-axis (non-scanning direction). The reticle R is supported, by way of a scanning stage 53 slidable in the X-direction, on a reticle base 54, and the wafer W is supported on a wafer stage 57 which scans the wafer W in the X-direction and defines its position in the Y-direction. The wafer stage 57 also incorporates a Z-stage which defines the position of the wafer W in the Z-direction.

The scanning stage 53 and the wafer stage 57 constitute a stage drive mechanism 70, of which function is controlled by the stage control system 47. At the scanning exposure operation, the reticle R is moved in a scanning motion by the scanning stage 53 with a predetermined velocity $V_R$ in the +X (or −X) direction with respect to the illumination area 52, and, in synchronization, a predetermined shot area on the wafer W is moved by the wafer stage 57 in a scanning motion with a velocity $V_W$ (=β·$V_R$) in the −X (or +X) direction with respect to the exposure field, whereby the pattern of the reticle R is transferred in sequential manner to said shot area.

Figure 6A:
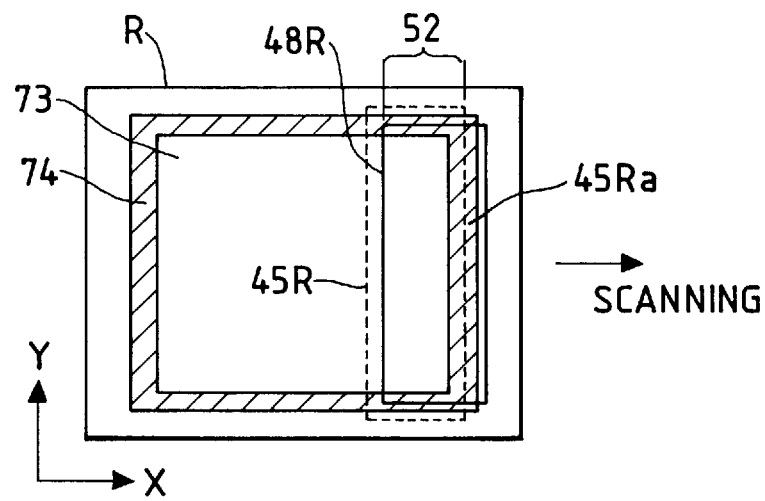
FIGS. 6A to 6C are views showing the function of movable blinds 45A, 45B in case of scanning exposure in the foregoing embodiment.
Figure 6B:
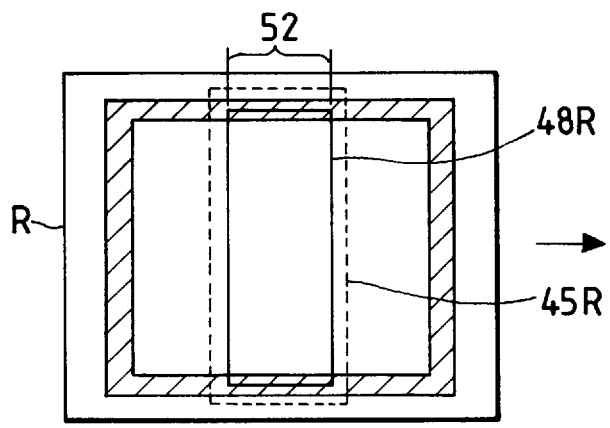
Figure 6C:
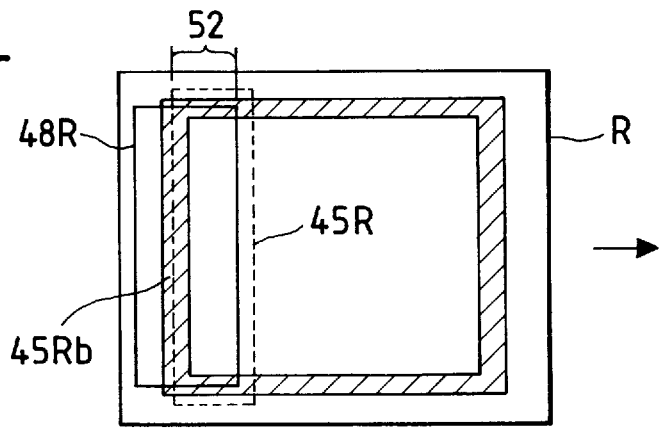

Immediately after the start of the scanning exposure, the image of the aperture of the fixed blind 48 shown in FIG. 1 overflows, as shown in FIG. 6A, an opaque area 74 surrounding a pattern area 73 of the reticle R. Therefore, for avoiding the exposure of an unnecessary area, the movable blade 45B shown in FIG. 1 is so moved that an edge 45Ra of the image 45R of the movable blind 45A, 45B remains in the opaque area 74. Subsequently, when the image 48R of the fixed blind 48 is contained, in the scanning direction, within the pattern area 73 as shown in FIG. 6B, the movable blind 45A, 45B is set that the image 45R thereof surrounds the above-mentioned image 48R. Also at the end of the scanning exposure, when the image 48R of the fixed blind 48 overflows the opaque area 74 as shown in FIG. 6C, the movable blade 45A shown in FIG. 1 is so moved that the other edge 45Rb of the image 45R of the movable blind 45A, 45B remains within the opaque area 74. Through these operations, the slit-shaped illumination area 52 is prevented from the overflowing beyond the opaque area 74, and the exposure of unnecessary pattern to the wafer W can be prevented.

Again referring to FIG. 1, in the vicinity of the wafer W on the wafer stage 57, there is provided an illumination intensity unevenness sensor 58 consisting of a photoelectric detector having a light-receiving face of a height equal to that of the exposed surface of the wafer W, and the detection signal from said sensor 58 is supplied to the main control system 41. Also on the wafer stage 57 there is provided a reference mark plate 59 for reticle alignment, bearing thereon a reference mark consisting of an aperture pattern, while corresponding alignment marks are formed on the reticle R. For example, when the reticle R is replaced, the reference mark plate 59 is moved into the effective exposure field of the projection optical system PL and the reference mark of said reference mark plate 59 is illuminated from the bottom side, by a light source 60, with illuminating light of a wavelength region the same as that of the illuminating light IL. Under said illuminating light, the images of the reference image and the alignment mark on the reticle R are observed by a reticle alignment microscope 55, through a mirror 56 positioned above the reticle R, and the reticle R is aligned with respect to the reference mark plate 59, based on the result of said observation.

Figure 4A:
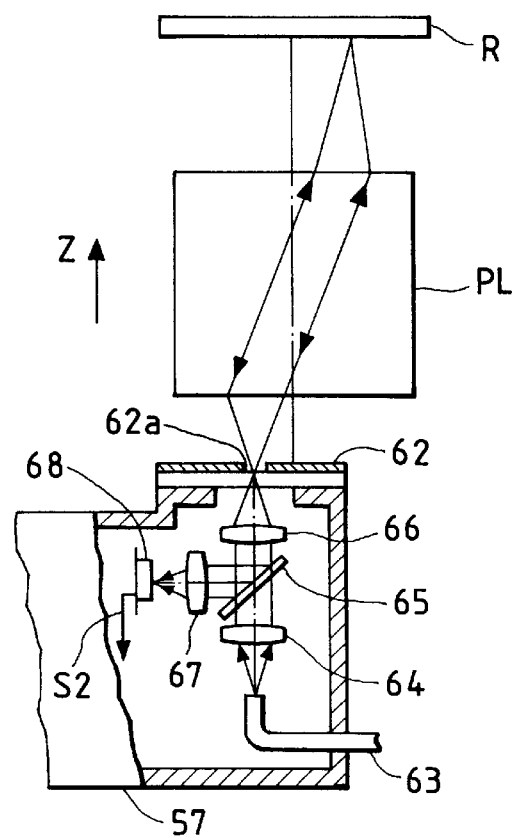
FIG. 4A is a partial view showing a mechanism for focus calibration.

Also on said wafer stage 57 there is provided, as shown in FIG. 4A, a reference mark plate 62 for focus calibration, bearing a reference mark 62a consisting for example of a cross-shaped aperture pattern. Said reference mark 62a is used for determining the position of the focal plane of the projection optical system PL in the following manner. Illuminating light of a wavelength region same as that of the illuminating light IL shown in FIG. 1 is guided into the wafer stage 57 through optical fibers 63 and illuminates the reference mark 62a from the bottom side through a collimating lens 64, a half mirror 65 and a condenser lens 66. The illuminating light transmitted by said reference mark 62a forms an image of the reference mark 62a on the pattern bearing face of the reticle R through the projection optical system PL, and the reflected light from said pattern bearing face returns through the projection optical system PL to the reference mark 62a. Then the illuminating light, returning to the reference mark 62a, is guided through the condenser lens 66, half mirror 65 and a condenser lens 67 and enters a photodetector 68.

Figure 4B:
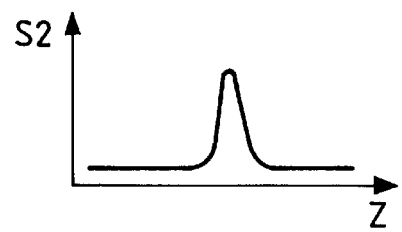
FIG. 4B is a chart showing the detection signal obtained by the mechanism shown in FIG. 4A.

The detection signal (photoelectric conversion signal) S2 of said photodetector 68 is supplied to the main control system 41 shown in FIG. 1. When the reference mark 62 is moved in the Z-direction by driving the Z-stage in the wafer stage 57, the detection signal S2 shows a maximum peak, as shown in FIG. 4B, when the Z-coordinate of the reference mark 62 coincides with the image plane of the projection optical system PL. Consequently the position of the image plane of the projection optical system PL can be determined from the variation of the detection signal S2, and the exposure operation can thereafter be executed in satisfactory state by setting the exposed surface of the wafer W at said position. In this manner the reference mark plate 62 can be utilized for calibration (focus calibration) of the position of the image plane of the projection optical system PL.

Again referring to FIG. 1, the leaking light transmitted by the mirror 43 of a reflectance of ca. 98% is condensed, through a condenser lens 10, on the light-receiving face of the integrating sensor 11. Said light-receiving face of the integrating sensor 11 is conjugate with the pattern bearing face of the reticle R and with the exposed surface of the wafer W, and the detection signal (photoelectric conversion signal) of the integrating sensor 11 is supplied to the exposure amount control system 38 and to the mercury lamp current control system 69. The exposure amount control system 38 is connected to a memory 77 which stores, for example, a conversion coefficient for determining the exposure energy on the wafer W from the output signal of the integrating sensor 11. In the present embodiment, however, the output signal of the integrating sensor 11 is calibrated with a predetermined reference illumination intensity meter as will be explained later, and a correction coefficient for correcting the output signal of the integrating sensor 11, based on the result of said calibration, is also stored in said memory 77.

Figure 2:
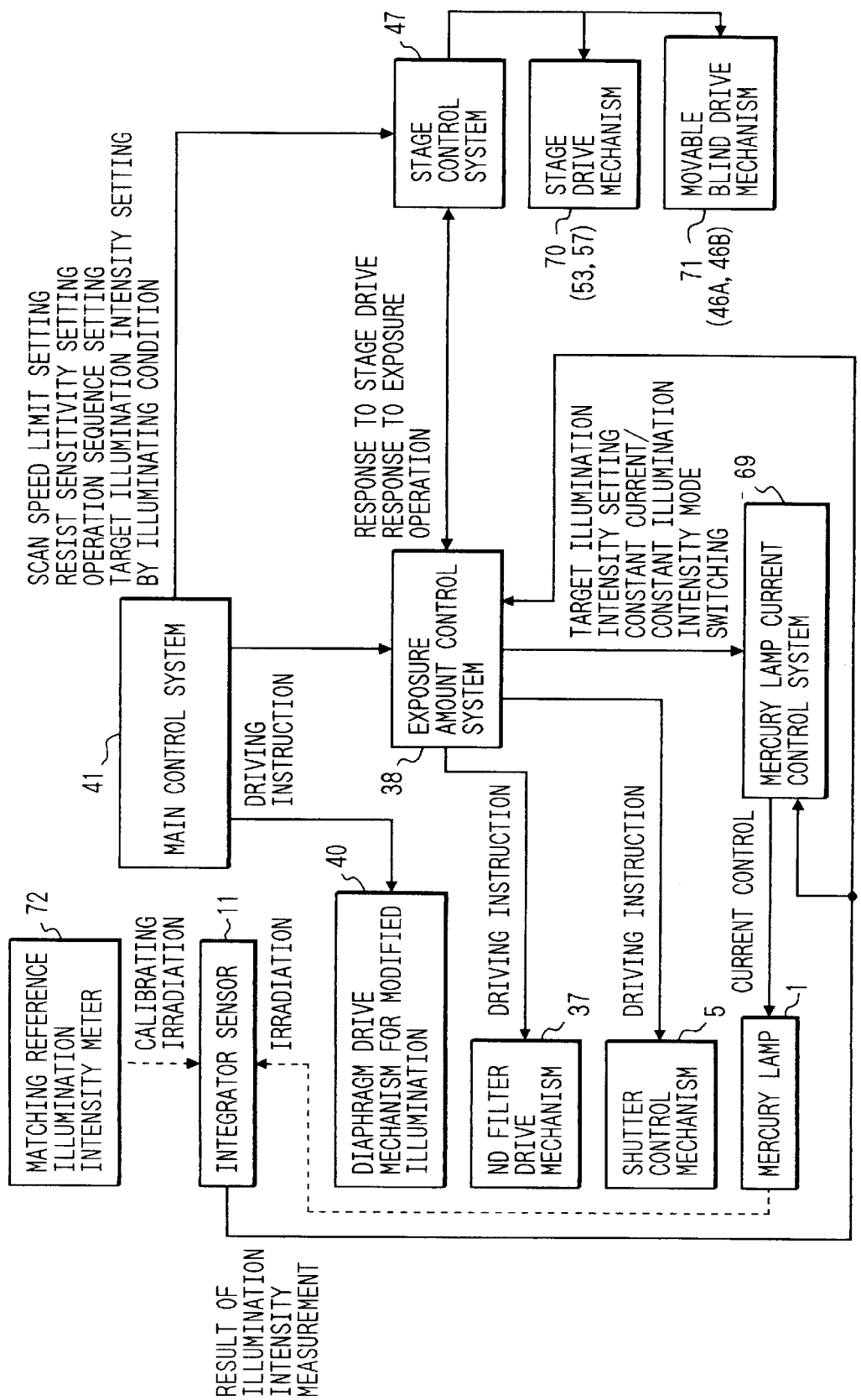
FIG. 2 is a block diagram of the control system in the apparatus shown in FIG. 1.

FIG. 2 shows the configuration of a control system in the apparatus shown in FIG. 1. Referring to FIG. 2, when the main control system 41 change the illumination system diaphragm by means of the modified illumination diaphragm drive mechanism 40, the exposure amount control system 38 in response set the current to be supplied to the mercury lamp 1 through the mercury lamp current control system 69, in such a manner that the detection signal of the integrating sensor 11 assumes a predetermined value. In case the control of the current supplied to the mercury lamp 1 is insufficient, the exposure amount control system 38 changes the transmittance of the ND filter plate 34 shown in FIG. 1, by means of the ND filter drive mechanism 37. The mercury lamp current control system, in the constant power mode, supplies the mercury lamp 1 with thus set current, while, in the constant illumination intensity mode, controls the current to the mercury lamp 1 in such a manner that the detection signal from the integrating sensor 11 assumes a constant level, as will be explained later.

In the following there will be explained the illumination intensity controlling operation in the projection exposure apparatus of the present embodiment. In the present embodiment, the reticle R is illuminated either in a constant power mode for supplying the mercury lamp 1 with a constant current, or in a constant illumination intensity mode for controlling the current to the mercury lamp 1 in such a manner that the output signal from the integrating sensor 11 shown in FIG. 1 assumes a constant level. The projection exposure apparatus of the present embodiment is based on scanning exposure system, but it can also effect partial collective exposure by stopping the reticle R and the wafer W, for example in case of exposing a predetermined alignment mark of the reticle R onto the wafer W. Such exposure conducted in the stopped state will be called static exposure, while the exposure conducted by scanning exposure system will be called dynamic exposure.

In the operations of static exposure, dynamic exposure and other measurements such as focus calibration, the functions of the projection exposure apparatus of the present embodiment are divided into the cases (1) to (8) shown in FIG. 5, which will be individually explained in the following:

(1) Exposure field setting:

In the static exposure, the position of the movable blind 45A, 45B is so set that the illuminating light does not leak outside the opaque area 74 (cf. FIG. 6A) of the reticle R, as in the collective exposure method in the conventional stepper. During the exposure, the movable blind 45A, 45B remains fixed.

On the other hand, in the dynamic exposure, the movable blind 45A, 45B is driven, as already explained in relation to FIGS. 6A to 6C, in the course of the scanning motion of the reticle R, in synchronization with the function of the scanning stage 53 and the wafer stage 57 so as that the illuminating light does not leak outside the opaque area 74 of the reticle R.

(2) Shutter control:

In the static exposure, the exposure time is controlled by high-speed open-close operation of the shutter 4.

On the other hand, in the dynamic exposure, and, in case of ordinary sequence, the direction of scanning motion of the reticle R alternates for the exposures on the shot are as adjacent on the wafer W. In such ordinary sequence, the shutter 4 can remain always open, because the two movable blades 45A, 45B of the movable blind can alternately serve as the shutter. However, for example in case of shifting from a line of shot areas to another line, there may be executed a special sequence in which the reticle R is moved in a same scanning direction. In such special sequence, there is required an idle returning operation for returning the reticle R without exposure, in order to return the reticle R, after an exposure operation, to the scanning s tart position. During such idle returning operation, the shutter 4 has to be closed in order to avoid exposure, as the two movable blades 45A, 45B has a gap therebetween.

The shutter 4 is also closed for example in the focus calibration as explained in relation to FIGS. 4A and 4B, or in the reticle alignment utilizing the reticle alignment microscope 55 shown in FIG. 1.

(3) Variation in illuminating condition:

Variation of the illuminating means the change of the kind of the illuminating system diaphragm by rotation of the illuminating system diaphragm plate 39 shown in FIG. 1. The shutter 4 is usually operated also in such operation. Since such change of the illuminating system diaphragm varies the illumination intensity on the reticle R and the wafer W, the current supplied to the mercury lamp 1 and the rotation angle of the ND filter plate 34 have to be regulated in order to restore the illumination intensity to the target value. However, when the light amount varying member present between the mercury lamp 1 and the integrating sensor 11, such as the shutter 4, ND filter plate 34 or illuminating system diaphragm, is operated, the illumination intensity on the integrating sensor 11 may vary significantly in discontinuous manner that the constant illumination intensity control for the mercury lamp 1 may become no longer possible. For this reason, the mercury lamp 1 has to be switched in advance to the constant power control in any of the static exposure, dynamic exposure and various measurements.

(4) Integrator mode:

This mode effects control according to the detection signal of the integrating sensor 11.

In the static exposure, as in the conventional exposure apparatus of collective exposure system, the exposure amount control system 38 measures the integrated exposure amount on the wafer W by integrating the detection signal from the integrating sensor 11, and said integrated exposure amount is brought to the target exposure amount by the high-speed shutter control. In this case constant power control is adopted since fluctuation in time, in the illumination intensity of the mercury lamp 1, does not affect.

On the other hand, in case of the dynamic exposure, the integrated exposure amount on each point of the wafer W is given by:

$$\text{Integrated exposure amount} = (D1/V_W)E_W \tag{1}$$

wherein D1 is the width of the slit-shaped exposure field in the scanning direction; $V_W$ is the scanning speed of the wafer W; and $E_W$ is the illumination intensity on the wafer W.

In this case, since the width D1 of the slit-shaped exposure field is constant and the scanning speed $V_W$ is also controlled constant, the mercury lamp 1 has to be driven under the constant illumination intensity control in order to maintain the integrated exposure amount constant. In the constant illumination intensity control of the mercury lamp 1, the current thereto is so controlled that the illumination intensity measured by the integrating sensor 11 remains constant, so that the operation of the light amount varying members present between the mercury lamp 1 and the integrating sensor 11 is inhibited during such constant illumination intensity control.

In case of measurement such as focus calibration, there is adopted the constant power mode, since the control by the constant illumination intensity mode is not particularly required. However, in case of a measurement such as focus calibration for example at each replacement of the wafer W, the control is switched to the constant power mode when such measurement is executed.

(5) Timer mode:

In this mode, the mercury lamp 1 is driven in the constant power mode, and the shutter 4 is opened for a time set by a timer in the exposure amount control system 38, thereby guiding the illuminating light from the mercury lamp 1 toward the reticle R.

In the static exposure, such timer mode is not particularly required as an exposure sequence. However, such sequence may be temporarily utilized for the purpose of measurement, such as irradiating the projection optical system PL with the illuminating light only for a predetermined time in order to set the parameters for controlling the imaging characteristics of said projection optical system PL, or measuring the unevenness in the illumination intensity on the wafer stage 57. For this reason the timer mode under the constant power control is selected as a measurement mode usable in the static exposure.

Also in the dynamic exposure, it may be temporarily used for measurement, for example for checking the control operation of the imaging characteristics of the projection optical system in the scanning exposure operation, or for exposure by moving the reticle R only in one direction. In such operations, the movable blind 45A, 45B and the high-speed shutter 4 may be used in combination. The timer mode under the constant power control is used also in case the movable blind 45A, 45B and the shutter 4 are used in combination.

Also in case of measurement such as focus calibration at the wafer replacement, such measurement is executed in the above-explained constant power mode.

(6) Intelligent mode:

This is a variation of the constant illumination intensity mode. The mercury lamp 1 is not driven not in the vicinity of the maximum rated power but at a power lower by a certain extent than said maximum rated power, whereby the illumination intensity on the wafer is always maintained constant even when the mercury lamp 1 is used continuously. On the other hand, in the above-explained integrator mode or timer mode under the constant illumination intensity control, the mercury lamp 1 may be driven in the vicinity (for example about 98%) of the maximum rated power, so that the illumination intensity on the wafer W may become gradually lower as the light emission intensity of the mercury lamp 1 may decrease in time.

The intelligent mode is not used in the static exposure.

In the dynamic exposure, the intelligent mode is used for example in checking the resolving power of the projection optical system PL. For example, in case of scanning exposure with the i-line (wavelength 365 nm) of the mercury lamp 1, with the initial maximum illumination intensity Pi [mW/cm$^2$] on the wafer at the manufacture of the apparatus, the illumination intensity on the wafer decreases to about 70% of such initial value when the service life of the mercury lamp 1 comes to the end if it is driven with a same driving current. In the intelligent mode, in consideration of such deterioration, the current supplied to the mercury lamp 1 is initially so limited that the maximum illumination intensity on the wafer becomes about 0.7·Pi [mW/cm$^2$]. Thereafter the output of the integrating monitor 11 is monitored and the current to the mercury lamp 1 is so increased as to compensate the deterioration in the illumination intensity, whereby the illumination intensity on the wafer is always maintained at about 0.7·Pi [mW/cm$^2$].

However, at the measurement such as focus calibration at the wafer replacement, the control is switched to the constant power mode.

(7) Use of high-sensitivity photoresist:

In case of using a high-sensitivity photoresist in the static exposure, the exposure amount is controlled by the open time of the shutter 4, as in the conventional exposure apparatus of the collective exposure system. However, in case the aperture diameter of the field diaphragm 33 shown in FIG. 1 is enlarged, the shutter 4 has to be made larger for passing and intercepting the entire light beam transmitted through said aperture. Such larger shutter 4 requires a larger driving force and may be opened and closed at a high speed with the shutter drive mechanism 5 shown in FIG. 1, which is similar to the conventionally employed mechanism. In case an increase in the torque of the driving motor of the shutter control mechanism 5 is difficult to achieve, there may also be employed in combination control for reducing the transmittance of the ND filter plate 34, thereby decreasing the illumination intensity on the wafer.

On the other hand, in case of using a high-sensitivity photoresist in the dynamic exposure, there are employed, in combination, control by the light amount switching mechanism consisting of the ND filter plate 34 shown in FIG. 1 and control for regulating the current supplied to the mercury lamp 1, thereby adjusting the illumination intensity in continuous manner to the target value on the wafer.

(8) Use of low-sensitivity photoresist:

In case of using a low-sensitivity photoresist in the static exposure, the open time of the shutter 4 is elongated.

In case of using a low-sensitivity photoresist in the dynamic exposure, the scanning speed of the scanning stage 53 and the wafer stage 57 shown in FIG. 1 is lowered.

In the following there will be explained, with reference to FIGS. 7A and 7B, an example of the control sequence in the present embodiment for maintaining the integrated exposure amount for each shot area of the wafer W at the appropriate exposure amount.

At first there will be explained the principle of exposure amount control in the present embodiment. For a width L of the slit-shaped exposure field 61 in the scanning direction on the wafer W (said width being hereinafter called "slit width", corresponding to D1 in FIG. 10A), a scanning velocity v of the wafer W, a photosensitivity (resist sensitivity) E of the photoresist deposited on the wafer W, and an illumination intensity p on the wafer W, the condition for giving an appropriate integrated exposure to the photoresist on the wafer W is given by:

$$Ev=pL \tag{2}$$

which can be reformed as:

$$p/v=E/L \tag{3}$$

As the slit width L is constant while the resist sensitivity E can be given in arbitrary manner, the left-hand term p/v of the equation (3) has to be settable arbitrarily in continuous manner.

Then, for a length (shot length) S of each shot area on the wafer W in the scanning direction, the exposure time for each shot area is given by S/v, so that a higher throughput can be obtained for a larger scanning velocity. Thus, in case of exposure with the scanning velocity maintained at a maximum value determined in the stage system, the scanning velocity v assumes a predetermined maximum value in the equation (2), so that the illumination intensity p has to be variable in continuous manner in order to satisfy said equation (2) for an arbitrary resist sensitivity E.

Such variation of the illumination intensity p can be achieved by a lamp current control method for reducing the light emission energy of the mercury lamp 1 itself, or a light amount varying method for varying the light amount by inserting a filter with variable transmittance or a diaphragm with variable aperture area into the optical path of the illuminating light. The former method can vary the light amount in continuous manner within a limited range around a predetermined level, while the latter can vary the illumination intensity in discontinuous manner over a wide range. The present embodiment employs these two methods in combination, thereby varying the illumination intensity P on the wafer over a wide range and in continuous manner.

However, in case of using a low-sensitivity photo-resist, the resist sensitivity E (appropriate exposure amount) becomes larger so that the equation (3) may be unsatisfied as follows:

$$P/V<E/L \tag{4}$$

even when the illumination intensity p is taken at the maximum value P and the scan velocity v is taken at the maximum value V.

For such low-sensitivity photoresist, the scanning velocity v has to be lowered so as to satisfy the equation (3).

Also in case the diaphragm for modified light source method (diaphragm 42D in FIG. 3) or the diaphragm for reducing the numerical aperture (coherence factor σ) of the illuminating system (diaphragm 42B in FIG. 3) is inserted between the mercury lamp 1 and the wafer W in FIG. 1, there results a decrease in the illumination intensity P on the wafer. Therefore, for satisfying the equation (3), the scanning velocity v has to be similarly lowered.

Now there will be explained, with reference to FIGS. 7A and 7B, an example of the control sequence for exposure amount control based on the above-explained principle. This example assumes that the variation of transmittance to the illuminating light in the use of the ND filter plate 34 shown in FIG. 1 is within ±1% and that the maximum deterioration in time of the light emission energy of the mercury lamp 1 is 30%.

At first a step 101 in FIG. 7A turns on the mercury lamp 1 and drives it in the constant power mode by supplying the rated maximum power (maximum current). Then the shutter 4 is opened, the ND filter plate 34 is set at a transmittance of 100% and a diaphragm of the largest aperture area on the illuminating system diaphragm plate 39 is set at the exit face of the third fly's eye lens 36C (step 102). The illumination intensity on the wafer W in this state, i.e. the maximum illumination intensity P, is indirectly measured by the integrating sensor 11 and the result of measurement is stored in the memory in the exposure amount control system 38 (step 103), and the shutter 4 is closed (step 104).

Then, according to the reticle R to be used for exposure, there is set the diaphragm 42D for modified light source method or the diaphragm 42B of a smaller aperture area (step 105). The resist sensitivity E is measured in advance for example by a test exposure and is entered into the exposure amount control system 38 (step 107). Also the maximum velocity V of the wafer stage 57 at the scanning exposure and the slit length L are entered into the exposure amount control system 38 (step 108), and the exposure mode is also entered thereinto (step 109).

Then the sequence proceeds to a step 105 to a step 106, wherein the exposure amount control system 38 discriminates the exposure mode. In case of the integrator mode, a step 110 sets the maximum illumination intensity on the wafer W to be used thereafter at 98% of the maximum illumination intensity P measured in the step 103, and the sequence proceeds to a step 111. In case of the intelligent mode, a step 112 sets the maximum illumination intensity to be used thereafter on the wafer W at 71.5% of the illumination intensity at the mercury lamp replacement, and the sequence proceeds to the step 111. On the other hand, in case of the timer mode, a step 119 sets the maximum illumination intensity to be used thereafter on the wafer W at 98% of the measured maximum illumination intensity P and the sequence proceeds to a step 120.

Then, in case of the integrator mode or the intelligent mode, the exposure amount control system 38 in a step 111 determines the scanning velocity v of the wafer stage 57 and the illumination intensity P on the wafer W so as to satisfy the equation (3), based on the resist sensitivity E, maximum scanning velocity V slit length L and maximum illumination intensity P. Then, in a step 113, the exposure amount control system 38 sets the transmittance of the ND filter plate 34 so as to obtain said illumination intensity p and causes the stage control system 47 to close the movable blind 45A, 45B thereby intercepting the optical path of the illuminating light. In a next step 114, the shutter 4 is opened and the exposure amount control system 38 starts the light emission control of the mercury lamp 1 in the constant illumination intensity mode with the target illumination intensity p. Subsequently the exposure is executed by the scanning exposure system with the scanning velocity v of the wafer stage 57 in such a manner that the detection signal from the integrating sensor 11 remains at a constant value. After the completion of exposure, the mercury lamp 1 is switched to the constant power control (step 117), and the shutter 4 is closed (step 118) whereupon the exposure of a shot area on the wafer W is completed.

On the other hand, in case of the timer mode, a step 120 determines the scanning velocity v of the wafer stage 57 and the illumination intensity p on the wafer W so as to satisfy the equation (3), based on the resist sensitivity E, maximum scan velocity V, slit length L and maximum illumination intensity P. Then a step 121 sets the transmittance of the ND filter plate 34 so as to obtain said illumination intensity p and causes the stage control system 47 to close the movable blind 45A, 45B to intercept the optical path of the illuminating light. Then the shutter 4 is opened (step 122), and the exposure amount control system 38 starts the light emission control of the mercury lamp 1 in the constant illumination intensity mode with the target illumination intensity p. In this operation the target current I to be supplied to the mercury lamp 1 is determined (step 123). Then the mercury lamp 1 is switched to the constant power mode and the shutter 4 is closed (step 124). Then the exposure is executed for a predetermined time in the timer control method, with the scanning velocity v of the wafer stage 57 (step 125).

In the following there will be given detailed explanation, with reference to a flow chart shown in FIGS. 8A and 8B, on the method of determining the exposure conditions, such as the scan velocity v, in the foregoing step 111 or 120. In the following there will be investigated the condition accommodating the basic illumination intensity P1 [mW/cm$^2$] on the wafer W by the illuminating light from the mercury lamp 1, the maximum scan velocity V1 [mm/s] of the wafer stage 57 and the minimum resist sensitivity E1 [mJ/cm$^2$] on the wafer W. In this case, if the maximum scan velocity of the wafer stage 57 limited by the mechanical structure is V2 (>V1) [mm/s], the maximum scan velocity of the wafer stage 57 is preferably maintained at V1 in order to allow the use of light amount switching by the ND filter plate 34.

Also, for the resist sensitivity E1 [mJ/cm$^2$], the maximum scan velocity V1 [mm/s] and the slit width L, the minimum illumination intensity P2 on the wafer W is given by:

$$P2=E1 \cdot V1/(4L) \tag{5}$$

As an example, said minimum illumination intensity P2 is about 16% of the desirable illumination intensity P1. If the illumination intensity can be varied within a range of 100 to 70% by the control of the current supplied to the mercury lamp 1, it becomes necessary to reduce the illumination intensity to about 23% in discontinuous manner by the ND filter plate 34 and to vary the illumination intensity, in said discontinuous range, in continuous manner by the control of the current supplied to the mercury lamp 1.

However, the ND filters generally have a transmittance error of about ±10%. For an inexpensive configuration, there can be conceived a mechanism capable of varying the illumination intensity in substantially continuous manner by combining a first ND filter changing mechanism for selecting one out of five ND filters of mutually different transmittances and a second ND filters of mutually different transmittances and a second ND filter changing mechanism for selecting one out of four ND filters of mutually different transmittances. In the present embodiment, therefore, if the ND filter plate 34 bears five ND filters thereon, a second ND filter plate bearing four ND filters is provided therebehind and the illumination intensity is controlled by selecting one out of 20 transmittances obtained by combining the five ND filters and the four ND filters mentioned above.

More specifically, the five ND filters on the first ND filter plate 34, specified by parameters a1 to a5, are respectively given transmittances 100, 82, 74, 66 and 59%. Also the four ND filters on the second ND filter plate, specified by parameters b1 to b4, are respectively given transmittances 100, 53, 31 and 19%. Combinations of the ND filters of the parameters a1 to a5 and those of the parameters b1 to b4 provide various transmittances shown in Table 1, which also shows the attenuation rates of the illumination intensity when the current supplied to the mercury lamp 1 is set at 98.0% and 71.5% of the maximum current in each combination of the parameters a and b. For example, for a combination of the parameters a1 and b1, the overall attenuation rates for the illumination intensity are 98.0% and 71.5%, and the variable range of the current supplied to the mercury lamp 1 is selected as 98.0 to 71.5% of the maximum current.

Table 1

| b<br>a | 1 (100) | 2 (53) | 3 (31) | 4 (19) |
|---|---|---|---|---|
| 1 (100) | 98.0/71.5 | 55.9/40.8 | 32.7/23.8 | 21.1/15.4 |
| 2 (82) | 72.3/64.4 | 41.3/36.8 | 24.1/21.5 | 15.6/13.9 |
| 3 (74) | 65.2/58.2 | 37.2/33.2 | 21.8/19.4 | 14.0/12.5 |
| 4 (66) | 58.2/51.9 | 33.2/29.6 | 19.4/17.3 | — |
| 5 (59) | 52.0/46.4 | 29.7/26.5 | 17.3/15.5 | — |

Illumination intensity attenuation rate: current 98.0% / 71.5%

As will be apparent from Table 1, the attenuation rate for the illumination intensity can be continuously varied within a range from 98.0% to 15.5% by the above-mentioned current control for the mercury lamp 1 and the combination of the two ND filter plates. The variable range of the current control is selected as 98.0 to 71.5% in order to enable correction for a current control error of ±0.5%, an ND filter transmittance drift of ±1.0% and a deterioration of −0.5% of the light emission power of the mercury lamp 1 within the exposures of the wafers of a lot and to avoid the change in the combination of the ND filters during the exposures on the wafers of a lot.

However, the transmittances of the actually prepared ND filters do not necessarily match the values set in Table 1. Therefore, the transmittances of the ND filters are at first measured, in order to enable correction of the deviation of the transmittances from the design values, by driving the mercury lamp 1 in the constant voltage control and monitoring the detection signal of the integrating sensor 11 while suitably switching the ND filters. In this measurement, the detection signal of the integrating sensor 11 is taken as a reference signal for a combination of parameters a1 and b1, wherein the first and second ND filter plates have a design transmittance of 100%, and a value obtained by dividing the detection signal of the integrating sensor 11 for an arbitrary combination of parameters a and b with said reference signal is memorized, as a parameter pa1 (a, b) in the memory of the exposure amount control system 38.

Then the illuminating system diaphragm plate 39 is further rotated, and the illumination intensity is similarly measured by the integrating sensor 11 for the diaphragm for modified illumination and that for varying the numerical aperture of the illuminating system, and the illumination, intensity ratios (in comparison with the ordinary diaphragm 42A) are also memorized as parameters pa2(c), in which c indicates the illuminating condition (kind of the diaphragm to be used).

It is assumed that the following exposure conditions are given from the main control system 41 to the exposure amount control system 38 shown in FIG. 1:

TABLE 2

| Resist sensitivity: | E [mJ/cm²] |
|---|---|
| Maximum scan velocity: | Vm [mm/sec] |
| Maximum illumination intensity: | Pm [mW/cm₂] (at lamp replacement) |
| Illuminating condition: | parameter c |
| Exposure mode: | parameter d |

(d = 1: integrator mode; d = 2: intelligent mode; d = 3: timer mode)

In this case, the actual exposure conditions are determined according to the sequence shown in FIGS. 8A and 8B. At first a step 131 supplies the maximum rated current to the mercury lamp 1, sets the transmittances of the two ND filter plates at 100% (design value), also sets the diaphragm 42A of the largest aperture area in the diaphragm plate 39 and measures the current maximum illumination intensity Pn by the integrating sensor 11. Then a step 132 discriminates the exposure mode from the parameter d. In case of the integrator mode or the timer mode, the parameter m1 is set as "1" (step 135) and the sequence proceeds to a step 134. In case of the intelligent mode, the parameter m1 is set as Pm/Pn (step 133), and the sequence proceeds to the step 134.

The step 134 sets the parameters a and b at "1", thus selecting the transmittances of the two ND filter plates at 100%, and a step 136 calculates the maximum velocity v1 and the minimum velocity v2 from the following equations:

$$v1 = 0.98 \cdot m1 \cdot Pn \cdot pa1(a, b) \cdot pa2(c) \cdot L/E \tag{6}$$

$$v2 = 0.715 \cdot Pn \cdot pa1(a, b) \cdot pa2(c) \cdot L/E \tag{7}$$

Then a step 137 compares the maximum scan velocity Vm in Table 2 with the variables v1 and v2, and, if v1>Vm and Vm≧v2, the sequence proceeds to a step 138 for setting the target illumination intensity P of the mercury lamp 1 at Vm·E/L. Then the scanning velocity of the wafer stage 57 is set at the maximum velocity Vm (step 139) and the sequence proceeds to a step 140. In case of Vm≧v1 in the step 137, the sequence proceeds to a step 146 for reducing the scan velocity V of the wafer stage 57 to the maximum velocity v1. Then the target illumination intensity P is set at 98% of the maximum illumination intensity Pn (step 147) and the sequence proceeds to the step 140. In case of Vm<v2 in the step 137, the sequence proceeds to a step 148 to discriminate whether the parameter a has reached 5.

As the parameter a is currently "1", it is increased by one (step 151), then the parameter m1 is set at "1" (step 152) and the sequence returns to the step 136. If the step 148 identifies that the parameter a has reached 5, there is discriminated whether the parameter b has reached 4 (step 149). If the parameter b is "4", the resist sensitivity is excessively high, so that, in a step 150, the exposure amount control system 38 provides the main control system 41 with information on the resist sensitivity setting error, and, in response, the main control system provides a display for said error on an unrepresented display unit. On the other hand, if the step 149 identifies that the parameter b is equal to or less than 3, the parameter a is set at "1" while the parameter b is increased by one (step 153) and the sequence proceeds to a step 152.

The step 140 sets a diaphragm of the diaphragm plate 39 according to the parameter c and ND filters of the two ND filter plates according to the parameters a, b, and a step 141 opens the shutter 4. Then the constant illumination intensity control is started with the scan velocity V of the wafer stage 57 and with the target illumination intensity P of the mercury lamp 1 (step 142), and the exposure mode is discriminated by the parameter d (step 143). In case of the integrator mode or the intelligent mode, the exposure is executed in the scanning exposure method, while, in the timer mode, a step 144 determines the average current I of the mercury lamp 1 at the constant illumination intensity control, then a step 145 executes exposure by switching to the constant power control utilizing said target current I, and the shutter is closed after the lapse of the time set by the timer.

The exposure amount control on the wafer by the above-explained illumination intensity control is to suppress the unevenness in the illumination intensity resulting from the variation in the exposure amount, but such unevenness can also be alleviated to a certain extent by an improvement in the precision of the sensors, such as the integrating sensor 11, or in the method of illumination intensity measurement. Methods of such improvement will be explained in the following:

(A) Reference illumination intensity meter

As shown in FIG. 2, the present embodiment employs the reference illumination intensity meter 72 for calibrating the detection signal of the integrating sensor 11. Said reference illumination intensity meter 72 is used as a reference for matching the exposure amounts in plural projection exposure apparatus. As the size and position of the light-receiving face of the integrating sensor 11 are determined according to the response speed and the precision of measurement, the reference illumination intensity meter 72 used for calibration thereof is required to have the light-receiving face of an equivalent size in consideration of the image magnification, and the measurement is required to be executed at a position conjugate with the integrating sensor 11. In such measurement, for confirming the relationship between the illumination intensity and the detection signal of the integrating sensor 11 within the actual range of the intensity of the illuminating light, the illumination intensity of the illuminating light is varied in linkage with the exposure amount control system 38 and the detection signal of the integrating sensor 11 and that of the reference illumination intensity meter 72 are fetched and compared.

The reference illumination intensity meter 72 itself may be calibrated, utilizing another sensor capable of measuring the absolute illumination intensity. However, as it is anticipated difficult to control the illumination intensity by the absolute value, the output signal of a single reference illumination intensity meter is regarded as the absolute reference for a set of the projection exposure apparatus to be employed for overlaid exposures of different layers of a single wafer, and is used for calibrating all the integrating sensors 11 of such plural projection exposure apparatus.

In this method, the stability of the output of the reference illumination intensity meter 72 needs to be assured only during the calibration of said set of projection exposure apparatus by said reference illumination intensity meter 72. Since the exposure amount for each shot area on the wafer is independently determined in each projection exposure apparatus and used as the target value, the linearity to the absolute illumination intensity is not very important, though linearity of a certain level is required between the illumination intensity and the detection signal of the integrating sensor 11 because the relationship therebetween is determined utilizing the reference illumination intensity meter 72.

(B) Integrating sensor

The integrating sensor 11 is used for measuring the illumination intensity, for controlling the integrated exposure amount in the static exposure and for the constant illumination intensity control of the mercury lamp 1 in the dynamic exposure. As the illumination intensity has to be measured with a high precision even in case of variation of the illuminating condition, such as the change to the modified light source method, the light-receiving face of the integrating sensor 11 has to be optically conjugate with the reticle. Also the light-receiving face of the integrating sensor 11 is preferably larger for improving the reliability. However, as high stability of the detection signal and a high-speed sampling are desired at the same time, said light-receiving face is made as large as possible within an extent satisfying the requirement for the stability of the detection signal and the response speed.

After the integrating sensor 11 is calibrated by the reference illumination intensity meter 72 as shown in FIG. 2, said integrating sensor 11 is used as the absolute reference for the illumination intensity of the illuminating light in the projection exposure apparatus containing said integrating sensor 11. For this reason, high reproducibility and stability are required for the measurement. Also in case of exposures of different layers of the wafer with respectively determined exposure amounts in plural projection exposure apparatus, it is necessary to match the exposure amounts among such plural projection exposure apparatus. The above-mentioned reference illumination intensity meter 72 is used for this purpose. In the actual exposure on each layer of the wafer, the target exposure amount for each layer is independently determined by each projection exposure apparatus, so that the linearity of the detection signal of the integrating sensor 11 with respect to the output signal of the reference illumination intensity meter 72 also becomes an error factor for the matching precision of the exposure amounts among plural projection exposure apparatus.

(C) Illumination intensity unevenness measuring sensor

In the present embodiment, the wafer stage 57 is provided, as shown in FIG. 1, with an illumination intensity unevenness sensor 58 which contains a photoelectric conversion element and is used for measuring the positions of the movable blind 45A, 45B and of the fixed blind 48, and the unevenness in the illumination intensity at the static exposure operation or at the dynamic exposure operation.

Figure 9:
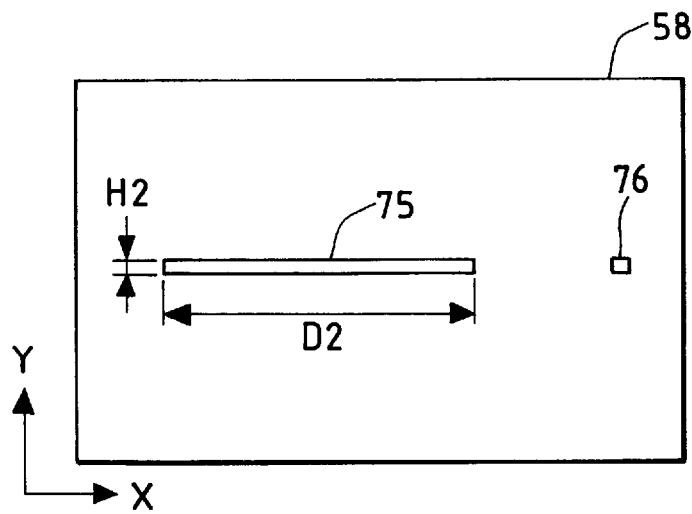
FIG. 9 is a magnified plan view of a light-receiving face of an illumination intensity unevenness sensor 58.

FIG. 9 shows the shape of the light-receiving face of said illumination intensity unevenness sensor 58, said face containing a slit-shaped aperture 75 of a length D2 in the X (scanning) direction and a width H2 in the Y-direction, and a small circular aperture 76 of a diameter approximately equal to H2. The length D2 of the aperture 75 in the X-direction is selected larger (for example by about 10 mm) than the width D1 of the exposure field 61 in the X-direction, and the width H2 (equal to the diameter of the aperture 76) of said aperture 75 in the Y-direction is selected approximately equal to the positional resolving power (for example in the order of 0.1 mm) in the illumination intensity measurement. The light beam entering the slit-shaped aperture 75 is condensed by a cylindrical lens onto the light-receiving face of a first photoelectric converting element, while the light beam entering the aperture 76 enters the light-receiving face of a second photoelectric converting element. The first photoelectric converting element sends a first detection signal S1 to the main control system 41 shown in FIG. 1, while the second photoelectric converting element sends a second detection signal thereto. The measurement of the position of the movable blind 45A, 45B and of the fixed blind 48 and the measurement of the unevenness in the illumination intensity at the static exposure can be executed by moving the aperture 76 in scanning motion in the X- and Y-directions within a plane containing the exposure field 61 of the projection optical system PL. Such measurement can be achieved by moving the aperture 76 in the vicinity of the contour of the exposure field 61, while the illuminating light is guided to the movable blind 45A, 45B through the opened shutter 4.

Figure 10A:
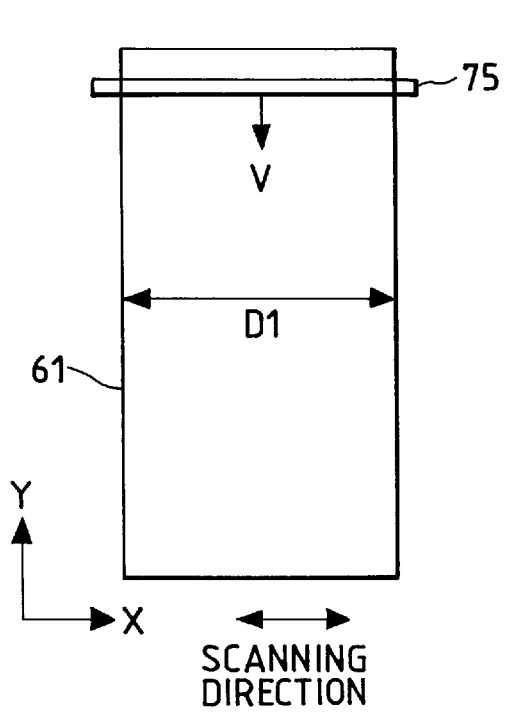
FIG. 10A is a magnified plan view showing the scanning of the exposure field with the illumination intensity unevenness sensor.
Figure 10B:
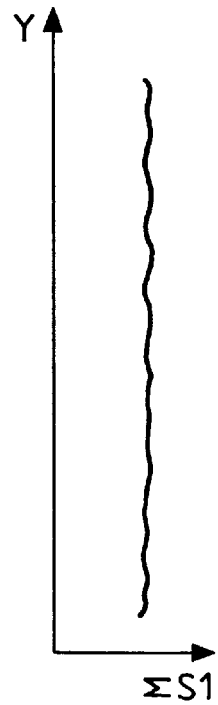
FIG. 10B is a chart showing an integration signal obtained by the scanning operation shown in FIG. 10A.

On the other hand, by scanning the exposure field 61 with the slit-shaped aperture 75 in the Y-direction perpendicular to the scanning direction, as shown in FIG. 10A, and by integrating the detection signal S1 for a predetermined time at each point in the Y-direction, there can be obtained an integrated signal $\Sigma S1$ varying according to the position Y, as shown in Fig. 10B. This integrated signal $\Sigma S1$ indicates the fluctuation of the integrated exposure amount in the Y (non-scanning) direction at each point on the wafer, in case the wafer is scan exposed with the exposure field 61 of the width D1. Consequently the unevenness in the illumination intensity at the dynamic exposure can be measured with the aperture 75.

At this measurement, the illumination intensity is optimized for obtaining highest precision for the aperture 75, for example by suitably selecting the ND filters on the ND filter plate 34 shown in FIG. 1.

In case the apertures 75 and 76 are alternately used, the level of the detection signal varies significantly without the gain control. Thus there is required auto gain control (AGC) for the detection signals of the photoelectric converting elements, in such a manner that both detection signals assume an approximately same level.

In the following there will be explained an example of adjustment of various mechanisms, utilizing said unevenness sensor 58.

(C-1) Adjustment of movable blind

The movable blind 45A, 45B has to be driven, in the scanning direction, in synchronization with the position of the opaque area 74 of the reticle R as shown in FIGS. 6A to 6C, but is basically similar, in function, to the reticle blind in the conventional imaging system. Consequently, independent position measuring means (such as a linear encoder) is provided along the movable blind 45A, 45B for enabling precise drive to the arbitrary position, and limit positions are set for avoiding the movement of the movable blind 45A, 45B outside the necessary drive range. For matching the position of the movable blind 45A, 45B with that of the opaque area 74 of the reticle R, actual exposure is executed after the loading of the reticle, then measured is the offset amount between the coordinate of the reticle R and that of the movable blind 45A, 45B when an edge of the illumination area 52 is contained in the opaque area 74 of the reticle R, and the correction thereafter is made with said offset value. Otherwise the coordinate of the movable blind 45A, 45B may be directly measured by moving the smaller aperture 76 of the sensor 58 shown in FIG. 9.

(C-2) Measurement of unevenness in illumination intensity at static exposure

The static exposure is used for checking the limit resolving power of the projection optical system PL or for various measurements. Said checking of the limit resolving power is usually conducted by measuring the resolving power at the center and four corners of the exposure field, and the unevenness in the illumination intensity at these measuring points needs only to be within a predetermined tolerance, so that the measurement of the unevenness in the illumination intensity at the static exposure may be limited to these measuring points for the limit resolving power.

(C-3) Measurement of unevenness in illumination intensity at dynamic exposure

The dynamic exposure is the ordinary exposure sequence for scanning exposure, with an extremely tight tolerance for the unevenness for the illumination intensity. For this reason the unevenness in the illumination intensity is measured with the slit-shaped aperture 75 of the sensor 58 shown in FIG. 9. More specifically, with reference to FIGS. 10A and 10B, for a width D1 of the slit-shaped exposure field 61 in the scanning direction and for a scanning velocity Vw of the wafer W, the exposure time at each point on the wafer W is given by D1/Vw (=Tw). Thus the wafer stage 57 is driven, while the exposure field 61 is irradiated with the illuminating light, to set the aperture 75 of the illumination intensity unevenness sensor 58 at an end of said exposure field 61, and the detection signal S1 of the first photoelectric conversion element of said sensor 58, corresponding to said aperture 75, is integrated for the time Tw to obtain the integrated signal $\Sigma S1$.

Subsequently the wafer stage 57 is driven to move the aperture 75 in the Y-direction by the width H2 of said aperture 75, and the detection signal corresponding to the light beam received through said aperture 75 is similarly integrated for the time Tw to obtain the integrated signal $\Sigma S1$. Thereafter the detection signal S1 is sampled for the time Tw, by similarly moving the aperture 75 by the width H2 in the Y-direction. Disregarding the stepping time of the wafer stage 57, the time required to obtain the integrated signals $\Sigma S1$ at the points in the Y-direction, over the width H1 of the exposure field 61 in the Y-direction, is approximately equal to (H1/H2)Tw (=$\Sigma T$). This measurement provides, as shown in FIG. 10B, the distribution of the integrated signal $\Sigma S1$, corresponding to the fluctuation in the integrated exposure amount (unevenness in illumination intensity) in the non-scanning direction, and the time $\Sigma T$ required for this measurement is only of the order of several tens of seconds.

The illumination intensity unevenness S (=maximum deviation/average) measured from the integrated signal $\Sigma S1$ shown in FIG. 10B contains the average error A of the illumination intensity uniformity in the scanning (X) direction, the illumination intensity stability B in each shot area on the wafer and the measurement precision C of the illumination intensity unevenness, and indicates the control precision of the illumination intensity unevenness S with respect to the target exposure amount (hereinafter called "target exposure amount precision").

For separating said target exposure amount precision S into the average error A in the scanning direction and the sum B' of the illumination intensity stability B in the shot area and the measurement precision C of the illumination intensity unevenness (said sum being hereinafter also called "illumination intensity stability in shot area"), the illumination intensity is measured by stopping the slit-shaped aperture 75, shown in FIG. 10A, for the time $\Sigma T$ required for the above-mentioned scanning in the Y-direction. In this operation the integrated signals $\Sigma S1$ are determined by integrating the detection signal S1 for respective periods Tw in said time $\Sigma T$, and the fluctuation of thus obtained integrated signals $\Sigma S1$ is determined. This fluctuation indicates the illumination intensity stability B' not dependent on the position of the slit-shaped aperture 75 in the Y-direction. This method provides the following two errors:

$$\text{Target exposure amount precision } S=(A^2+B^2+C^2)^{1/2} \quad (8)$$

$$\text{Illumination intensity stability B'in shot area}=(B^2+C^2)^{1/2} \quad (9)$$

From these equations (8) and (9), there can be determined the average error A of the illumination intensity uniformity in the scanning direction:

$$\text{Error } A=(S^2-B'^2)^{1/2} \quad (10)$$

Thus adjustments are so made that the target exposure amount control precision S obtained from the equation (8), the stability B obtained from the equation (9) and the average error A of the illumination intensity uniformity in the scanning direction, obtained from the equation (10) become respectively smaller than first, second and third predetermined precisions. In this operation, in relation to the illumination intensity stability B in each shot area, the fluctuation error of the light emission power of the mercury lamp 1, constituting a factor in said stability B, is intensity stability B' indicated by the equation (9) is analyzed by frequency and confirmation is made whether the result of such analysis satisfies the defined fluctuation error for each frequency region. In this case it is necessary to memorize all the sampled data of the illumination intensity stability B', instead of the average value thereof. The sampling frequencies are determined by the resolving power at the frequency analysis.

Also the illumination intensity stability among plural shot areas on the wafer can be confirmed by calculating the reproducibility of the average within a time obtained by dividing the width D1 of the exposure area 61 in the scanning direction by the scanning velocity Vw (i.e. exposure time at each point on the wafer), from the result of measurement of the illumination intensity stability B' represented by the equation (9).

Also the sensitivity unevenness among different points in the X-direction within the slit-shaped aperture 75 can be determined by reducing said exposure field 61 in the X-direction by suitably moving the movable blind 45A, 45B and measuring the fluctuation of the detection signal S1 obtained by moving the aperture 75 in the X-direction with respect to thus reduced exposure field 61. Such measurement may not be necessary since the requirement for such sensitivity unevenness is not tight.

More specifically, for a sensitivity unevenness of $\pm x[\%]$ for the illumination intensity measured by the aperture 75 and for an error $\Delta P$ in the illumination intensity uniformity, the measurement error in illumination intensity, resulting from said sensitivity unevenness becomes $\pm x \cdot \Delta P[\%]$ which is insignificantly small. Moreover, as the present embodiment employs the integration in the scanning direction in the illumination intensity measurement, the sensitivity unevenness within the aperture 75 practically constitutes only an even smaller error factor.

(C-4) Confirmation of exposure amount control operation

Figure 11A:
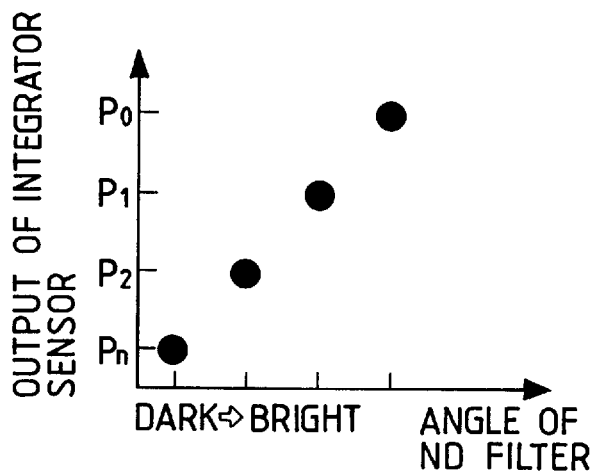
FIG. 11A is a chart showing the relationship between the output of the integrating sensor and the angle (illumination intensity) of the ND filter plate.

The exposure amount control in the present embodiment is achieved by continuous variation of the illumination intensity, through the combination of the switching of the ND filter plate 34 shown in FIG. 1 and the control of the current (power) supplied to the mercury lamp 1. Such continuous variation of the illumination intensity can be confirmed by switching the mercury lamp 1 to the constant power control and reading the output of the integrating sensor 11 while switching the overall transmittance of the ND filter plate 34 (in fact two ND filter plates) in succession. For example, there are obtained, as shown in FIG. 11A, outputs P0, P1, P2, ..., Pn of the integrating sensor 11 when the intensity of the illuminating light is reduced in succession from the maximum intensity, by rotating the two ND filter plates. The output P0 corresponds to the highest overall transmittance (100%) of the two ND filter plates, while the output Pn corresponds to the lowest transmittance.

Then considered is an output Pn-1 of the integrating sensor 11, corresponding to the second lowest transmittance of the two ND filter plates, and there is confirmed whether the following condition is satisfied when the target illumination intensity of the mercury lamp 1 in the constant power control is taken as 100% of the limit maximum illumination intensity:

$$0.98 Pn > 0.715 Pn-1 \quad (11)$$

If this condition is not satisfied, the ND filter in said ND filter plates is to be replaced.

Then the target illumination intensity of the mercury lamp 1 in the constant power control is maintained at the maximum value (100% of the limit maximum illumination intensity) and at the minimum value (70% of the limit maximum illumination intensity), and there is confirmed that the ratio of the corresponding outputs of the integrating sensor 11 becomes equal to or less than 7/10. These measurements may be conducted under a certain combination of the ND filters.

(C-5) Confirmation of precision of exposure amount calibration

The precision of calibration of the exposure amount on the wafer can be defined by the precision of calibration of the reference illumination intensity meter 72 (cf. FIG. 2) and the drift of the detection signal of the integrating sensor 11. Said calibration can be achieved by setting the reference illumination intensity meter 72 on the wafer stage 57, and plotting, as shown in FIG. 11B, the outputs of the integrating sensor 11 and of the reference illumination intensity meter 72 while switching the combination of the ND filters of the ND filter plates in succession under the constant power control.

Figure 11B:
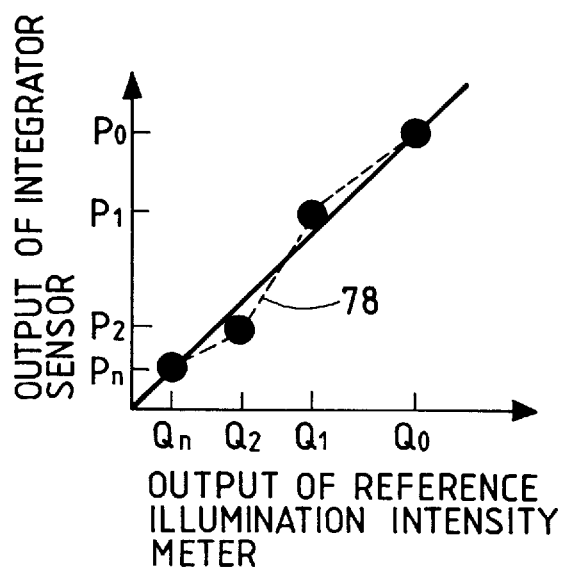
FIG. 11B is a chart showing the relationship between the output of the integrating sensor and the output of the reference illumination intensity meter.

In FIG. 11B, the outputs P0, P1, P2, ..., Pn of the integrating sensor 11 respectively correspond to those Q0, Q1, Q2, ..., Qn of the reference illumination intensity meter 72. The linearity between both outputs is determined by calculating a first-order approximation line by the minimum square method based on the output data and determining the error between said line and each point in FIG. 11B. It is however difficult to maintain the linearity value of the reference illumination intensity meter 72 smaller than the linearity required for the integrating sensor 11.

Consequently the measured points are connected by straight line portions as indicated by 78 in FIG. 11B, and the differences from the above-mentioned first-order approximation line are memorized in the memory 77 shown in FIG. 1. In the subsequent measurement of the illumination intensity, the exposure amount control system 38 corrects the output of the integrating sensor 11 by the difference memorized in the memory 77. In this manner the calibration error with respect to the reference illumination intensity meter 72 can be limited to the error approximation with straight line portions and the error in measurement. This adjustment method is applicable even when the reference illumination intensity meter 72 has a poor linearity. In such case all the projection exposure apparatus to be matched in the exposure amount are adjusted according to the linearity characteristics of the reference illumination intensity meter 72, so that, if a test exposure is executed in any of the exposure apparatus, the actual exposure can be made according to the condition of said test exposure in said plural projection exposure apparatus. It is however to be considered that such matching is not based on the absolute illumination intensity.

The foregoing embodiment employs the mercury lamp 1 as the exposure light source, but the present invention is applicable also in case a xenon lamp, for example, is used as the light source. Furthermore, the present invention is not limited to the exposure apparatus employing the projection optical system but likewise applicable to exposure apparatus of contact exposure or proximity exposure system. In this manner the present invention is not limited to the foregoing embodiment but is subject to various modifications within the scope of the present invention.

The above-explained exposure apparatus, being capable of switching the constant power mode and the constant illumination intensity mode according to the purpose, can therefore use the constant illumination intensity mode in case of exposure with the scanning exposure system, whereby the integrated exposure amount on the photosensitive substrate can be accurately maintained with an appropriate range and the fluctuation in said integrated exposure amount can be reduced.

Also in case of a change in the illuminating condition while the mask and the substrate are stopped, or of alignment of the mask and the substrate, or of adjustment of the scanning state of the mask and the substrate, the exposure light source is switched to the constant power mode, whereby possible drawbacks can be avoided in case the light entering the exposure amount measuring means (integrating sensor) is eventually intercepted. Particularly in the change of the illuminating condition, the constant illumination intensity mode requires a waiting time in order to respond to a significant variation in the illumination intensity, but the constant power mode dispenses with such waiting time, thus allowing to improve the throughput.

Furthermore, in the scanning exposure, the use of the constant illumination intensity mode allows to control the illumination intensity by the power supply means of a high response speed, without utilizing the illumination intensity varying means. Consequently the illumination intensity varying means, being not required to respond to a rapid variation in the light amount, can be simplified in structure and manufactured more inexpensively. Also as the illumination intensity varying means can achieve rough switching of the illumination intensity, the power supply means is only required to effect fine adjustment within a narrow range, so that the load on the exposure light source can be alleviated.

Also there can be provided conversion coefficient memory means for memorizing, by approximation with a curve (or straight line portions), conversion coefficients from photoelectric signals obtained by measuring plural light beams of mutually different light amounts with the exposure amount measuring means to photoelectric signals obtained by measuring said light beams with the predetermined reference illumination intensity meter, and signal correction means for correcting the photoelectric signals, released from said exposure amount measuring means, with the conversion coefficients read from said memory means, and the exposure amounts can be matched among plural exposure apparatus utilizing said reference illumination intensity meter. This configuration can suppress the calibration error to the reference illumination intensity meter, since the relation to the output thereof is memorized not by the first-order linear approximation but by the approximation with a curve.

It is furthermore possible to reduce the fluctuation of the integrated exposure amount in the non-scanning direction on the photosensitive substrate, by determining the illumination intensity distribution in said non-scanning direction within the exposure area, based on photoelectric signal obtained by scanning said exposure area, in said non-scanning direction, with the photosensor means having a slit-shaped light-receiving face, and suppressing said fluctuation in the illumination intensity by illumination intensity distribution control means.

Furthermore, the combined use of said photosensor means having the slit-shaped light-receiving face and another photosensor means having a small spot-shaped light-receiving face allows to separate the control precision of the integrated exposure amount on the substrate with respect to the target value, the average error of the illumination intensity uniformity in the scanning direction, and the illumination intensity stability in each exposure area on the substrate, thereby facilitating the investigation of the precision for each factor.

What is claimed is:

1. An exposure apparatus of a scanning exposure system that illuminates an illumination area on a mask bearing a pattern, the pattern projecting to a substrate with the illuminating light from an exposure light source, and that moves said mask in a scanning motion with respect to said illumination area and moves, in synchronization, the substrate in a scanning motion with respect to an exposure area which is optically conjugate with said illumination area, thereby exposing said substrate to the pattern of said mask, comprising:

a power supply system that supplies said exposure light source with an electric power regulated to a predetermined state;

an illumination intensity varying system provided between said exposure light source and said substrate, that regulates the attenuation rate of said illuminating light;

an exposure amount measuring sensor that measures the exposure energy of the illuminating light emitted by said exposure light source; and a control system that switches a constant power mode for supplying said exposure light source with a predetermined constant electric power through said power supply system and a constant illumination intensity mode for controlling the function of said power supply system and said illumination intensity varying system in such a manner that the exposure energy measured by said exposure amount measuring sensor is maintained at a predetermined target value;

wherein said control system is adapted to switch said two modes in accordance with whether or not the pattern of said mask is exposed.

2. An exposure apparatus according to claim 1, wherein said control system is adapted to select said constant illumination intensity mode when said mask and said substrate are moved in synchronized scanning motion, and said constant power mode when said mask and said substrate are stopped.

3. An exposure apparatus according to claim 1, wherein said control system is adapted to select said constant illumination intensity mode when said substrate is exposed to the pattern of said mask, and said constant power mode in the alignment of said mask and said substrate.

4. An exposure apparatus according to claim 1, wherein said control system is adapted to select said constant power mode when said mask and said substrate are moved in synchronized scanning motion for adjusting the scanning state of said mask and said substrate, and said constant illumination intensity mode when said mask and said substrate are moved in synchronized scanning motion for exposing said substrate to the pattern of said mask.

5. An exposure apparatus according to claim 1, further comprising:

a memory system for memorizing, by approximation with a curve, conversion coefficients for converting signals, obtained from plural light beams of mutually different light amounts by photoelectric conversion in said exposure amount measuring sensor, into signals obtained from said light beams by photoelectric conversion in a predetermined reference illumination intensity meter; and a signal correcting system that corrects the photoelectric conversion signals, released from said exposure amount measuring sensor, with the conversion coefficients read from said memory system.

6. An exposure apparatus for exposing a substrate to a pattern for transfer, formed on a mask, by moving said mask and said substrate in synchronization, comprising:

a power supply system that supplies an exposure light source with a predetermined electric power;

an illumination intensity varying system that regulates the attenuation rate of the illuminating light from said exposure light source;

a sensor that measures the energy of said illuminating light; and a control system that switches plural modes for controlling the energy of said illuminating light in accordance with whether or not the pattern of said mask is exposed.

7. An exposure method for exposing a substrate to a pattern for transfer, formed on a mask, by moving said mask and said substrate in synchronization, comprising the steps of:

supplying an exposure light source with a predetermined electric power;

regulating the attenuation rate of the illuminating light from said exposure light source;

measuring the energy of said illuminating light; and switching plural modes for controlling the energy of said illuminating light in accordance with whether or not the pattern of said mask is exposed.

8. An exposure method according to claim 7, further comprising the steps of:

correcting the measured value of the energy of said illuminating light with a predetermined conversion factor.

9. An exposure apparatus of a scanning exposure system that illuminates an illumination area on a mask bearing a pattern for transfer with the illuminating light from an exposure light source, and that moves said mask in a scanning motion with respect to said illumination area and moves, in synchronization, a substrate in a scanning motion with respect to an exposure area which is optically conjugate with said illumination area, thereby exposing said substrate to the pattern of said mask, comprising:

a power supply system that supplies said exposure light source with an electric power regulated to a predetermined state;

an illumination intensity varying system provided between said exposure light source and said substrate, that regulates the attenuation rate of said illuminating light;

an exposure amount measuring sensor that measures the exposure energy of the illuminating light emitted by said exposure light source;

an optical system that adjusts the intensity of said illuminating light;

a driving system that drives said optical system; and a control system adapted to select a first mode when said optical system is driven, and a second mode when said optical system is not driven, said first mode being a constant power mode, and said second mode being a constant illumination intensity mode.

10. An exposure apparatus according to claim 9, wherein said constant illumination intensity mode has at least one of a mode for keeping the velocity of said scanning constant, a mode for emitting said illuminating light with the constant power mode for a predetermined time period, and a mode for emitting said illuminating light with a constant illumination intensity.

11. An exposure apparatus of a scanning exposure system that illuminates an illumination area on a mask bearing a pattern for transfer with the illuminating light from an exposure light source, and that moves said mask in a scanning motion with respect to said illumination area and moves, in synchronization, a substrate in a scanning motion with respect to an exposure area which is optically conjugate with said illumination area, thereby exposing said substrate to the pattern of said mask, comprising:

a power supply system that supplies said exposure light source with an electric power regulated to a predetermined state;

an illumination intensity varying system provided between said exposure light source and said substrate, that regulates the attenuation rate of said illuminating light;

an exposure amount measuring sensor that measures the exposure energy of the illuminating light emitted by said exposure light source;

an illuminating system that changes an illumination condition of said illuminating light; and a control system that switches a constant power mode and a constant illumination intensity mode in accordance with the change of said illumination condition.

12. An exposure method for exposing a substrate to a pattern for transfer, formed on a mask, by moving said mask and said substrate i n synchronization with mutually different velocities, comprising the steps of:

supplying an exposure light source with a predetermined electric power;

regulating the attenuation rate of the illuminating light from said exposure light source;

measuring t he energy of said illuminating light;

changing an illumination condition of said illuminating light; and switching plural modes for controlling the energy of said illuminating light in accordance with the change of said illumination condition.

a control system that switches a constant power mode and a constant illumination intensity mode in accordance with the change of said illumination condition.

13. An exposure apparatus of a scanning exposure system, comprising:

a sensor that measures the exposure energy of illuminating light emitted by an exposure light source; and a memory system that memorizes conversion coefficients for converting signals, obtained from plural intensities of illuminating light by photoelectric conversion in said sensor, into signals obtained from said plural intensities of illuminating light by photoelectric conversion in a predetermined reference illumination intensity meter; and a signal correcting system that corrects photoelectric conversion signals, released from said sensor, with conversion coefficients read from said memory system.

14.. An exposure apparatus according to claim 13, wherein said reference illumination intensity meter is detachable.

15. An exposure apparatus according to claim 13, further comprising:

an illumination intensity varying system provided between said exposure light source and a substrate, that regulates an illumination intensity of said illuminating light; and a correcting system that corrects an output from said sensor based on each of outputs from said reference illumination intensity meter illuminated with a plurality of different illumination intensities by using said illumination intensity varying system.

16. An exposure apparatus according to claim 15, wherein said correcting system includes:

a calculating system that makes an approximate calculation for obtaining the conversion coefficients based on each of the outputs from said reference illumination intensity meter;

a memory that stores the calculation results; and a correcting unit that corrects the output from said sensor with the conversion coefficients outputted from said memory.

17. An exposure apparatus according to claim 16, wherein said approximate calculation includes at least one of a curved line approximation and a polygonal line approximation.

18. An exposure apparatus of a scanning exposure system for exposing a substrate to a pattern of a mask, comprising:

a power supply system that supplies an exposure light source with electric power;

an illumination intensity varying system provided between said exposure light source and said substrate;

an exposure amount measuring sensor that measures exposure energy of illuminating light emitted by said exposure light source; and a control system that switches a constant power mode for supplying said exposure light source with a predetermined constant electric power through said power supply system and a constant illumination intensity mode for controlling said power supply system;

wherein said control system is adapted to select said constant illumination intensity mode when said mask and said substrate are moved in synchronized scanning motion, and said constant power mode when said mask and said substrate are stopped.

19. An exposure method for exposing a substrate to a pattern for transfer, formed on a mask, by moving said mask and said substrate synchronously, comprising the steps of:

regulating an attenuation rate of illuminating light from an exposure light source;

measuring energy of said illuminating light; and switching plural modes for controlling the energy of said illuminating light in accordance with whether or not the pattern of said mask is exposed.

20. An exposure apparatus of a scanning exposure system for exposing a substrate to a pattern of a mask, comprising:

a power supply system that supplies an exposure light source with electric power;

an illumination intensity varying system provided between said exposure light source and said substrate;

an illuminating system That chances an illumination condition of said illuminating light; and a control system that switches a constant power mode and a constant illumination intensity mode in accordance with the change of said illumination condition.

21. A scanning exposure method for exposing a substrate to a pattern formed on a mask, comprising the steps of:

regulating illuminating light from an exposure light source;

changing an illumination condition of said illuminating light; and switching plural modes for controlling the energy of said illuminating light in accordance with the change of said illumination condition.

22. A scanning exposure method, comprising the steps of:

obtaining correction coefficients between signals obtained from illuminating an intensity measuring sensor and a reference sensor with a plurality of light intensities; and correcting information obtained from said intensity measuring sensor based on said correction coefficients.

23. A scanning exposure apparatus that exposes a substrate to a predetermined pattern while moving the substrate, comprising:

an exposure light source;

a power supply system that supplies said exposure light source with electric power;

an illumination intensity varying system provided between said exposure light source and said substrate, that regulates an illumination intensity of illuminating light emitted by said exposure light source;

an exposure amount measuring system provided between said exposure light source and said substrate, that measures an exposure amount of said illuminating light;

a measuring sensor that measures the maximum illumination intensity of said exposure light source;

an illumination intensity restricting system that restricts the maximum output illumination intensity of said illuminating light in accordance with said measured maximum illumination intensity; and a calculating system that decides a scanning speed based on said maximum output illumination intensity.

24. A scanning exposure apparatus that exposes a substrate to a predetermined pattern while moving the substrate, comprising:

an illumination intensity varying system that varies an illumination intensity of illuminating light;

a sensor that senses unevenness in the illumination intensity, the sensor having a small spot-like light-receiving surface and a slit-like light-receiving surface which are disposed on a stage holding said substrate; and a selecting system that selects the spot-like light-receiving surface or the slit-like light-receiving surface in accordance with different operations performed by said apparatus.

25. A scanning exposure apparatus according to claim 24, wherein said selecting system selects the slit-like light-receiving surface upon dynamic exposure operation, and selects the spot-like light-receiving surface upon a static exposure operation.

* * * * *